United States Patent
Ogawa

(10) Patent No.: US 12,244,283 B2
(45) Date of Patent: Mar. 4, 2025

(54) LC RESONATOR AND LC FILTER

(71) Applicant: Murata Manufacturing Co., Ltd., Nagaokakyo (JP)

(72) Inventor: Keisuke Ogawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 147 days.

(21) Appl. No.: 17/881,701

(22) Filed: Aug. 5, 2022

(65) Prior Publication Data

US 2022/0385260 A1 Dec. 1, 2022

Related U.S. Application Data

(63) Continuation of application No. PCT/JP2021/008660, filed on Mar. 5, 2021.

(30) Foreign Application Priority Data

Apr. 10, 2020 (JP) .................. 2020-070825

(51) Int. Cl.
*H03H 7/01* (2006.01)
*H01F 27/29* (2006.01)
*H01F 27/40* (2006.01)
*H03H 1/00* (2006.01)

(52) U.S. Cl.
CPC .......... *H03H 7/0115* (2013.01); *H01F 27/29* (2013.01); *H01F 27/40* (2013.01); *H03H 2001/0085* (2013.01)

(58) Field of Classification Search
CPC .............. H03H 2001/0085; H03H 7/0115
USPC .................................. 333/175, 185
See application file for complete search history.

(56) References Cited

U.S. PATENT DOCUMENTS

| 2012/0119852 A1* | 5/2012 | Sasaki | H03H 7/42 333/204 |
| 2013/0076454 A1 | 3/2013 | Imamura | |
| 2013/0154769 A1 | 6/2013 | Masuda | |

FOREIGN PATENT DOCUMENTS

| JP | 2006262349 A | 9/2006 |
| JP | 2013070288 A | 4/2013 |
| JP | 2013128232 A | 6/2013 |
| WO | 2007119356 A1 | 10/2007 |
| WO | 2015059963 A1 | 4/2015 |

OTHER PUBLICATIONS

International Search Report in PCT/JP2021/008660, mailed Apr. 20, 2021, 3 pages.
Written Opinion in PCT/JP2021/008660, mailed Apr. 20, 2021, 4 pages.

* cited by examiner

*Primary Examiner* — Rakesh B Patel
(74) *Attorney, Agent, or Firm* — Keating & Bennett, LLP

(57) ABSTRACT

An LC resonator includes first and second plane electrodes, a first line electrode, a first and second via conductors, and a third plane electrode. The second plane electrode is opposed to at least a portion of the first plane electrode in a specific direction. The first via conductor and the second via conductor extend from the first line electrode in the specific direction to be connected to the first plane electrode and the second plane electrode, respectively. The third plane electrode is opposed to at least a portion of the second plane electrode in the specific direction. The second plane electrode is between the first plane electrode and the third plane electrode in the specific direction.

20 Claims, 29 Drawing Sheets

LC RESONATOR AND LC FILTER

CROSS REFERENCE TO RELATED APPLICATIONS

This application claims the benefit of priority to Japanese Patent Application No. 2020-070825 filed on Apr. 10, 2020 and is a Continuation Application of PCT Application No. PCT/JP2021/008660 filed on Mar. 5, 2021. The entire contents of each application are hereby incorporated herein by reference.

BACKGROUND OF THE INVENTION

1. Field of the Invention

The present application relates to an LC resonator and an LC filter.

2. Description of the Related Art

Conventionally, LC resonators and LC filters are known. For example, International Publication No. 2007/119356 discloses a multilayer band pass filter. The multilayer band pass filter includes a plurality of LC parallel resonators. In each of the plurality of LC parallel resonators, two via electrodes extend from a line electrode to a capacitor electrode and a ground connection electrode, respectively. The line electrode and the two via electrodes form a looping inductor, and the capacitor electrode and the ground connection electrode form a capacitor. When seen from the lined-up direction of the plurality of LC parallel resonators, by arranging the plurality of LC parallel resonators such that at least a portion of looping surfaces of the LC parallel resonators overlap with each other, a degree of coupling (inductive coupling) between the adjacent LC parallel resonators can be increased. As a result, band widening of the multilayer band pass filter is possible.

In many cases, characteristics of an LC filter (for example, bandpass characteristics, reflection characteristics, or attenuation characteristics) are realized by adjustment of a resonant frequency of an LC resonator at which an impedance becomes an extremum. In order to improve the characteristics of the LC filter, it is required to increase the number of LC resonators included in the LC filter. However, when the number of LC resonators is increased, the filter becomes larger in size, which may increase insertion loss.

SUMMARY OF THE INVENTION

Preferred embodiments of the present invention reduce or prevent an increase in size of an LC filter while improving characteristics of the LC filter.

An LC resonator according to a preferred embodiment of the present invention includes a first plane electrode, a second plane electrode, a first line electrode, a first via conductor, a second via conductor, and a third plane electrode. The second plane electrode is opposed to at least a portion of the first plane electrode in a specific direction. The first via conductor and the second via conductor extend from the first line electrode in the specific direction to be connected to the first plane electrode and the second plane electrode, respectively. The third plane electrode is opposed to at least a portion of the second plane electrode in the specific direction. The second plane electrode is between the first plane electrode and the third plane electrode in the specific direction.

In the LC resonators according to preferred embodiments of the present invention, the third plane electrode is opposed to at least a portion of the second plane electrode in the specific direction, and the second plane electrode is between the first plane electrode and the third plane electrode in the specific direction. Therefore, an increase in size of the LC filters can be reduced or prevented while improving the characteristics of the LC filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
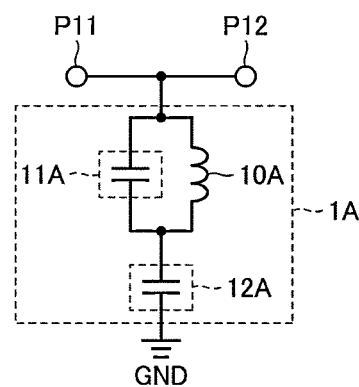
FIG. 1 is an equivalent circuit diagram of an LC resonator according to Preferred Embodiment 1 of the present invention.

Hereinafter, preferred embodiments of the present invention are described in detail with reference to the drawings. The same reference characters are given to the same or substantially the same configurations in the drawings.

Preferred Embodiment 1

FIG. 1 is an equivalent circuit diagram of an LC resonator 1A according to Preferred Embodiment 1 of the present invention. As illustrated in FIG. 1, the LC resonator 1A is connected between a connection node of input/output terminals P11 and P12 and a grounding point GND. The LC resonator 1A preferably includes an inductor 10A, a capacitor 11A, and a capacitor 12A. The inductor 10A and the capacitor 11A are connected in parallel between one electrode of the capacitor 12A and the connection node of the input/output terminals P11 and P12 so as to define an LC parallel resonant circuit. The other electrode of the capacitor 12A is grounded. The inductor 10A and the capacitor 12A are connected in series between the grounding point GND and the connection node of the input/output terminals P11 and P12 to define an LC series resonant circuit.

Figure 2:
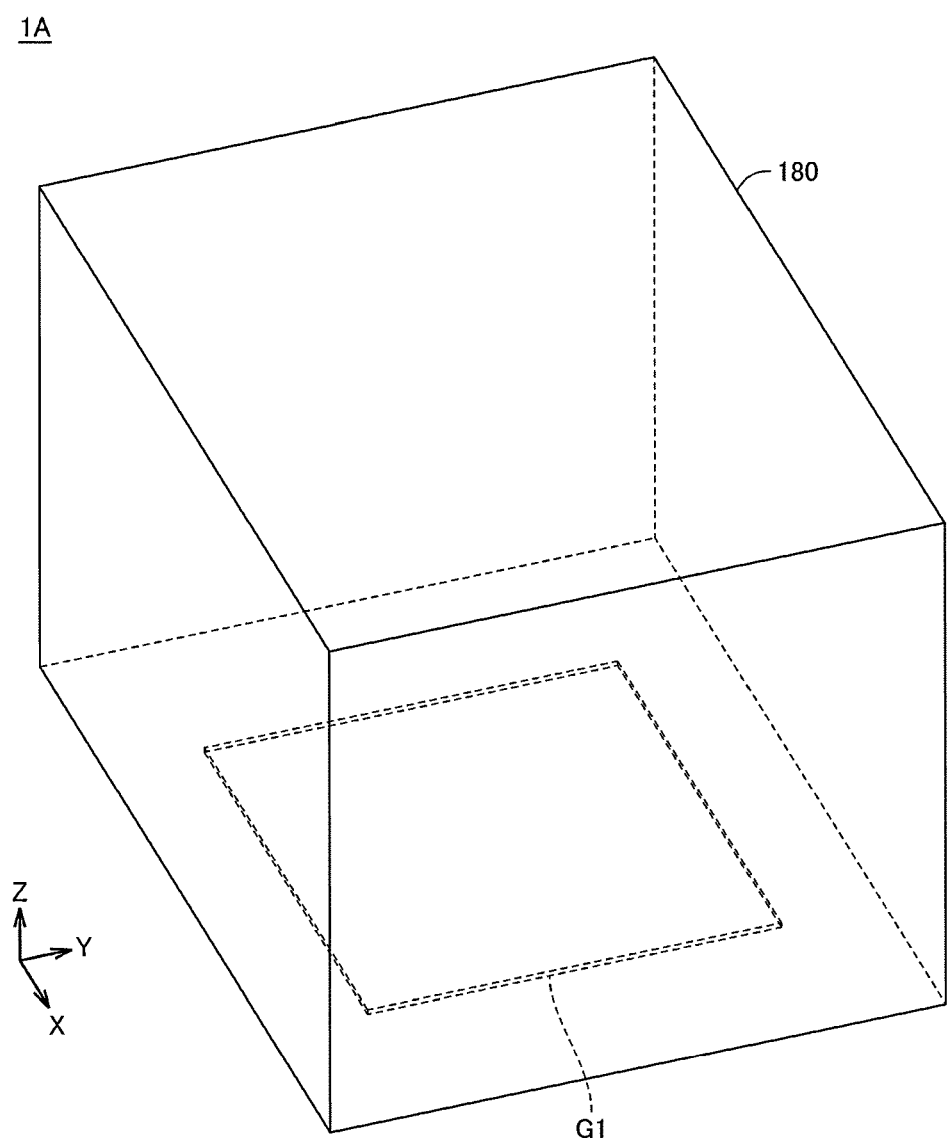
FIG. 2 is an external perspective view of the LC resonator of FIG. 1.

FIG. 2 is an external perspective view of the LC resonator 1A of FIG. 1. In FIG. 2, an X-axis, a Y-axis, and a Z-axis are perpendicular or substantially perpendicular to each other, which is also similar in FIGS. 3 to 5, FIGS. 11 to 14, FIGS. 16 to 18, and FIGS. 22 to 25. As illustrated in FIG. 2, the LC resonator 1A is preferably defined by a multilayer body 180 in which a plurality of dielectric layers are laminated in the Z-axis direction. A ground terminal G1 is preferably in or on a bottom surface of the multilayer body 190.

Figure 3:
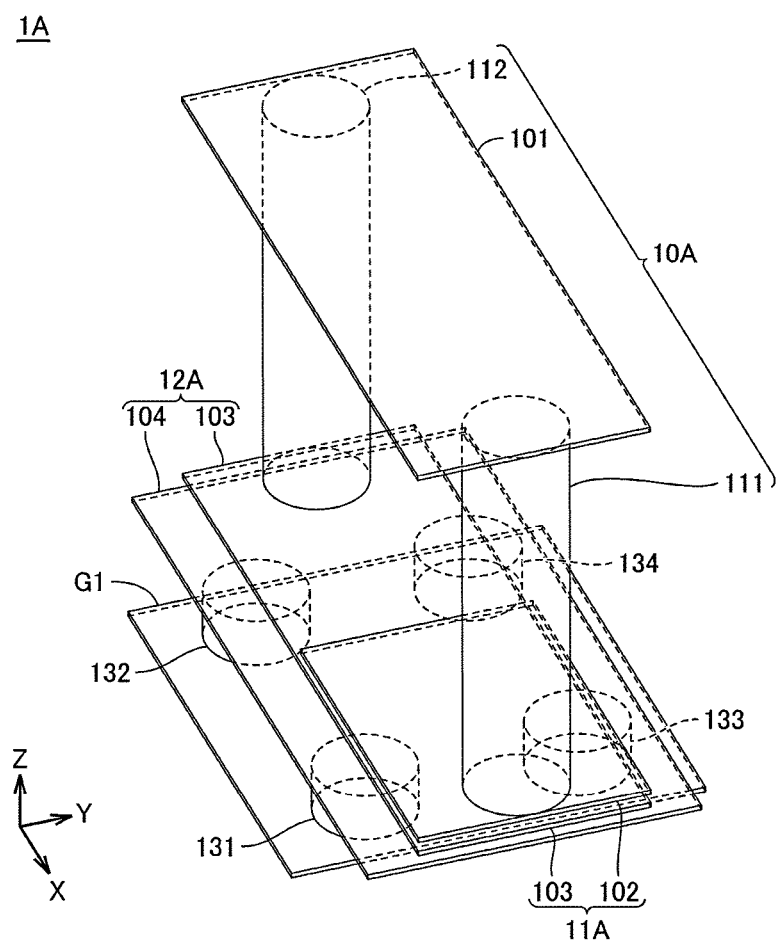
FIG. 3 is an external perspective view of an electrode structure inside a multilayer body of FIG. 2.
Figure 4:
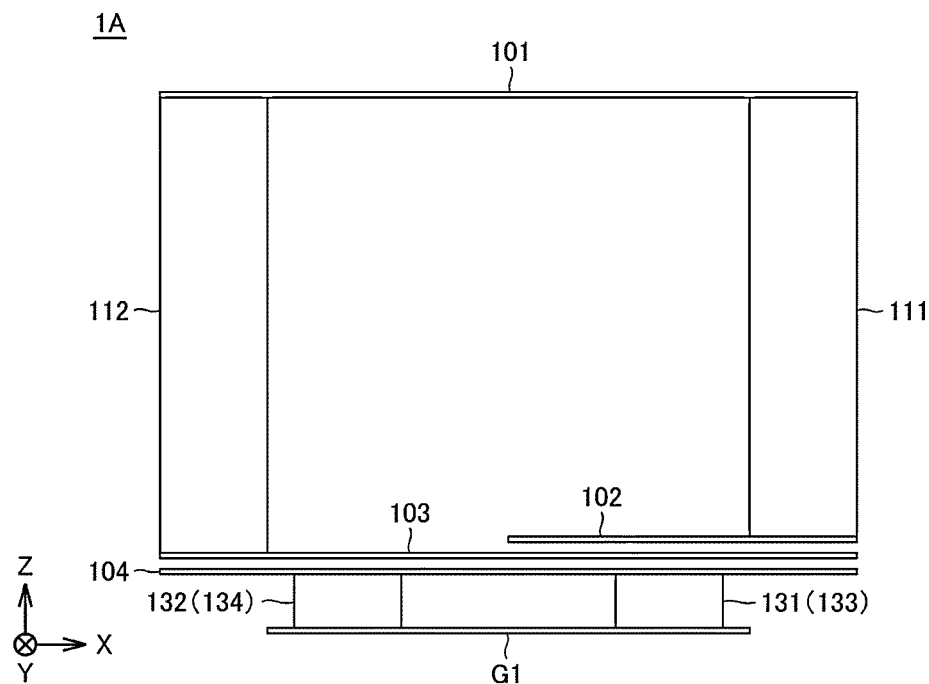
FIG. 4 is a view of the electrode structure of FIG. 3 when seen in a plan view from a Y-axis direction.
Figure 5:
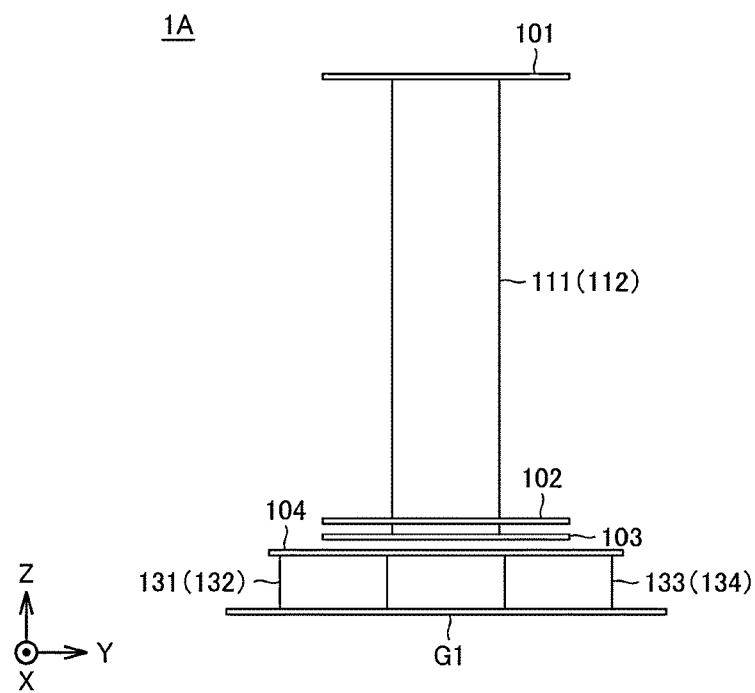
FIG. 5 is a view of the electrode structure of FIG. 3 when seen in a plan view from an X-axis direction.

FIG. 3 is an external perspective view of an electrode structure inside the multilayer body 180 of FIG. 2. FIG. 4 is a view of the electrode structure of FIG. 3 when seen in a plan view from a Y-axis direction. FIG. 5 is a view of the electrode structure of FIG. 3 when seen in a plan view from an X-axis direction. As illustrated in FIG. 3 to FIG. 5, the LC resonator 1A is preferably provided with a line electrode 101 (a first line electrode), a plane electrode 102 (a first plane electrode), a plane electrode 103 (a second plane electrode), a via conductor 111 (a first via conductor), a via conductor 112 (a second via conductor), a ground electrode 104 (a third plane electrode), and via conductors 131, 132, 133, and 134.

The plane electrode 103 is opposed to at least a portion of the plane electrode 102 in the Z-axis direction (specific direction). The plane electrodes 102 and 103 define the capacitor 11A.

The line electrode 101 extends in the X-axis direction. The via conductors 111 and 112 extend in the Z-axis direction from both end portions of the line electrode 101 to be connected to the plane electrodes 102 and 103, respectively. The via conductor 111, the line electrode 101, and the via conductor 112 define the inductor 10A.

The plane electrode 103 is between the plane electrode 102 and the ground electrode 104 in the Z-axis direction. The ground electrode 104 is opposed to at least a portion of the plane electrode 103 in the Z-axis direction. The plane electrode 103 and the ground electrode 104 define the capacitor 12A.

The ground electrode 104 is connected to the ground terminal G1 by each of the via conductors 131 to 134 to be grounded. The input/output terminals P11 and P21 in FIG. 1 is connected to, for example, the plane electrode 102 or the via conductor 111.

In the LC resonator 1A, the via conductors 111 and 112 defining the inductor 10A have different lengths in the Z-axis direction from each other, and the via conductor 112 is longer than the via conductor 111. Therefore, current concentrates more between the central portion of the line electrode 101 and the via conductor 112. As a result, worsening of loss due to the current concentration on an edge portion of the line electrode 101 can be improved.

Figure 6:
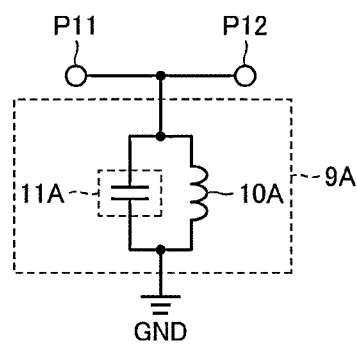
FIG. 6 is an equivalent circuit diagram of an LC parallel resonator according to a comparative example 1 of Preferred Embodiment 1 of the present invention.

FIG. 6 is an equivalent circuit diagram of an LC parallel resonator 9A according to a comparative example 1 of Preferred Embodiment 1. The LC parallel resonator 9A has a configuration in which the capacitor 12A is removed from the LC resonator 1A of FIG. 1. Since other configurations are the same or similar, description is not repeated. As illustrated in FIG. 6, the inductor 10A and the capacitor 11A are grounded.

Figure 7:
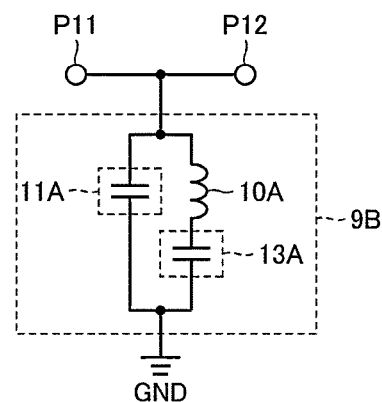
FIG. 7 is an equivalent circuit diagram of an LC resonator according to a comparative example 2 of Preferred Embodiment 1 of the present invention.

FIG. 7 is an equivalent circuit diagram of an LC resonator 9B according to a comparative example 2 of Preferred Embodiment 1. The LC resonator 9B has a configuration in which a capacitor 13A is added to the LC parallel resonator 9A of FIG. 6. Since other configurations are the same or similar, description is not repeated. As illustrated in FIG. 7, the inductor 10A and the capacitor 13A are connected in series between the grounding point GND and the connection node of the input/output terminals P11 and P12. The capacitor 11A and the capacitor 13A are connected in parallel between the grounding point GND and the connection node of the input/output terminals P11 and P12. The LC resonator 9B includes an LC parallel resonator defined by the inductor 10A and the capacitor 11A, and an LC series resonator defined by the inductor 10A and the capacitor 13A.

Figure 8:
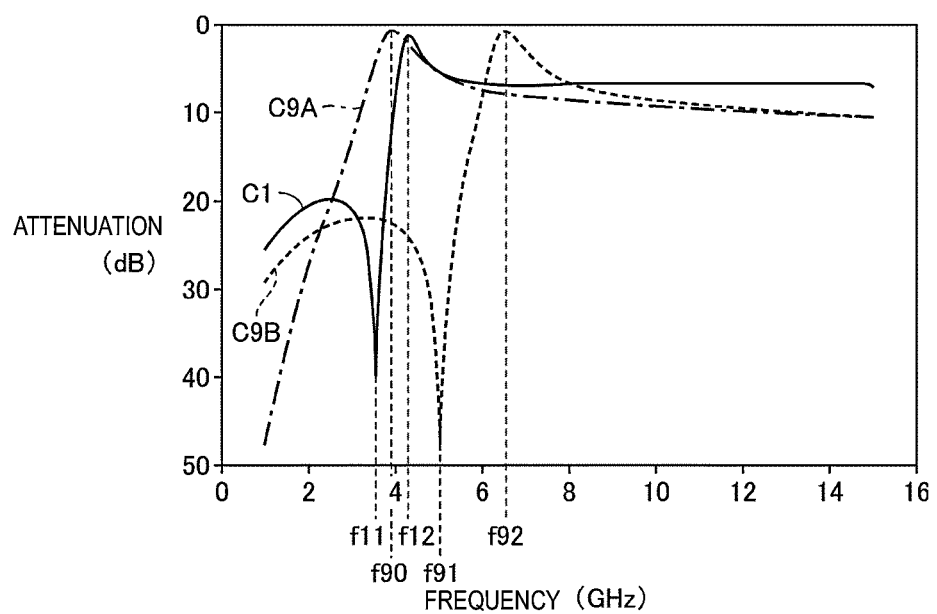
FIG. 8 is a diagram illustrating bandpass characteristics of the LC resonator of FIG. 1, the LC parallel resonator of FIG. 6, and the LC resonator of FIG. 7 altogether.

FIG. 8 is a diagram illustrating bandpass characteristics of the LC resonator 1A of FIG. 1, the LC parallel resonator 9A of FIG. 6, and the LC resonator 9B of FIG. 7 altogether. In FIG. 8, curved lines C1, C9A, and C9B indicate bandpass characteristics of the LC resonator 1A, bandpass characteristics of the LC parallel resonator 9A, and bandpass characteristics of the LC resonator 9B, respectively. Note that the bandpass characteristics indicated in FIG. 8 are bandpass characteristics when capacitances of the capacitors 11A to 13A are the same or substantially the same.

As illustrated in FIG. 8, in the bandpass characteristics of the LC parallel resonator 9A, an attenuation becomes the minimum at a frequency f90. In the bandpass characteristics of the LC resonator 9B, an attenuation becomes the maximum at a frequency f91, and becomes the minimum at a frequency f92 (>f91). In the bandpass characteristics of the LC resonator 1A, an attenuation becomes the maximum at a frequency f11, and becomes the minimum at a frequency f12 (>f11).

When comparing the bandpass characteristics of the LC resonator 1A and the bandpass characteristics of the LC parallel resonator 9A, since the LC parallel resonator 9A does not include an LC series resonator, an attenuation pole at which an attenuation becomes the maximum does not occur in the bandpass characteristics of the LC parallel resonator 9A. By providing the LC filter using the LC resonator 1A, attenuation characteristics which indicates performance of not passing signals outside a pass band can be improved as compared to the case of proving the LC filter using the LC parallel resonator 9A. Further, since a separate LC resonator to cause the attenuation pole is unnecessary, the LC filter can be decreased in size.

When comparing the bandpass characteristics of the LC resonator 1A and the bandpass characteristics of the LC resonator 9B, the frequency at which an attenuation becomes the maximum and the frequency at which an attenuation becomes the minimum are both lower in the LC resonator 1A. The frequencies at which attenuation becomes the maximum and minimum depend on a resonant frequency of the LC series resonator and a resonant frequency of the LC parallel resonator, respectively. As an inductance of the inductor and a capacitance of the capacitor defining the LC resonator decrease, the resonant frequency of the LC resonator becomes higher. By making the inductance of the inductor and the capacitance of the capacitor included in the LC resonator 1A smaller than the inductance of the inductor and the capacitance of the capacitor included in the LC resonator 9B, respectively, the bandpass characteristics of the LC resonator 1A can be made closer to the bandpass characteristics of the LC resonator 9B. That is, when obtaining an LC filter having desired bandpass characteristics, the size of the LC filter can be made smaller when using the LC resonator 1A as compared to when using the LC resonator 9B.

Figure 9:
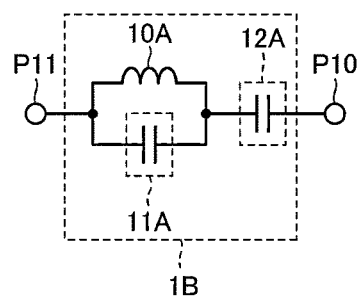
FIG. 9 is an equivalent circuit diagram of an LC resonator according to a modification of Preferred Embodiment 1 of the present invention.

Although, in the LC resonator 1A, the configuration in which the capacitor 12A is grounded is described, it is not always required to be grounded. FIG. 9 is an equivalent circuit diagram of an LC resonator 1B according to a modification of Preferred Embodiment 1. In FIG. 9, the third plane electrode of the capacitor 12A which is grounded in FIG. 1 is connected to an input/output terminal P10. Since other configurations are the same or similar, description is not repeated.

As described above, the LC resonator according to Preferred Embodiment 1 and the modification can reduce or prevent an increase in size of the LC filter while improving the characteristics of the LC filter.

In Preferred Embodiments 2 to 6 of the present invention, an LC filter including the LC resonator according to Preferred Embodiment 1 is described. In Preferred Embodiment 2, a two-stage LC filter including two LC resonators is described, in Preferred Embodiments 3, 4, and 5, a four-stage LC filter including four LC resonators is described, and in Preferred Embodiment 6, a five-stage LC filter including five LC resonators is described.

Preferred Embodiment 2

Figure 10:
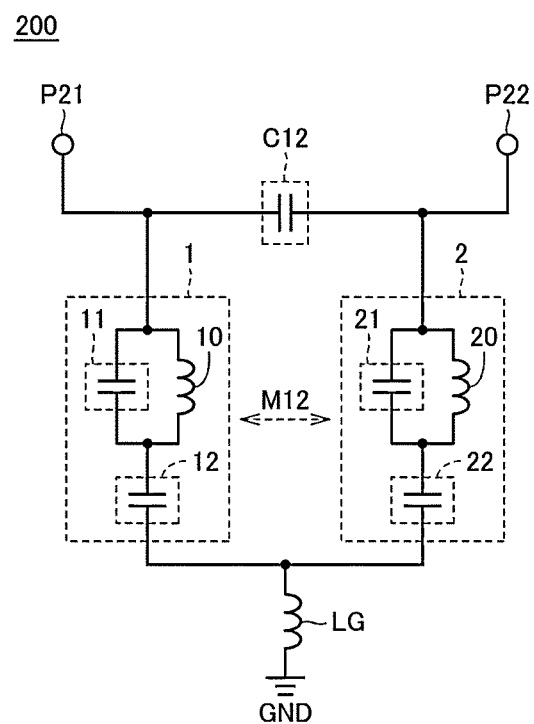
FIG. 10 is an equivalent circuit diagram of a band pass filter as one example of an LC filter according to Preferred Embodiment 2 of the present invention.

FIG. 10 is an equivalent circuit diagram of a band pass filter 200 as one example of an LC filter according to Preferred Embodiment 2 of the present invention. As illustrated in FIG. 10, the band pass filter 200 includes an input/output terminal P21 (a first terminal), an input/output terminal P22 (a second terminal), an LC resonator 1 (a first LC resonator), an LC resonator 2 (a second LC resonator), a capacitor C12, and an inductor LG. The band pass filter 200 is a two-stage band pass filter.

One end of the inductor LG is connected to the grounding point GND. The LC resonator 1 is connected between the input/output terminal P21 and the other end of the inductor LG. The LC resonator 2 is connected between the input/output terminal P22 and the other end of the inductor LG. A magnetic coupling M12 occurs between the LC resonators 1 and 2. The capacitor C12 is connected between the LC resonators 1 and 2. The capacitor C12 indicates a capacitive coupling which occurs between the LC resonators 1 and 2.

The LC resonator 1 includes an inductor 10 and capacitors 11 and 12. The LC resonator 2 includes an inductor 20 and capacitors 21 and 22. Each of the LC resonators 1 and 2 has the same or substantially the same configuration as the LC resonator 1A illustrated in FIG. 1. That is, the inductor 10 and the capacitors 11 and 12 correspond to the inductor 10A and the capacitors 11A and 12A, respectively. The inductor 20 and the capacitors 21 and 22 correspond to the inductor 10A and the capacitors 11A and 12A, respectively.

Figure 11:
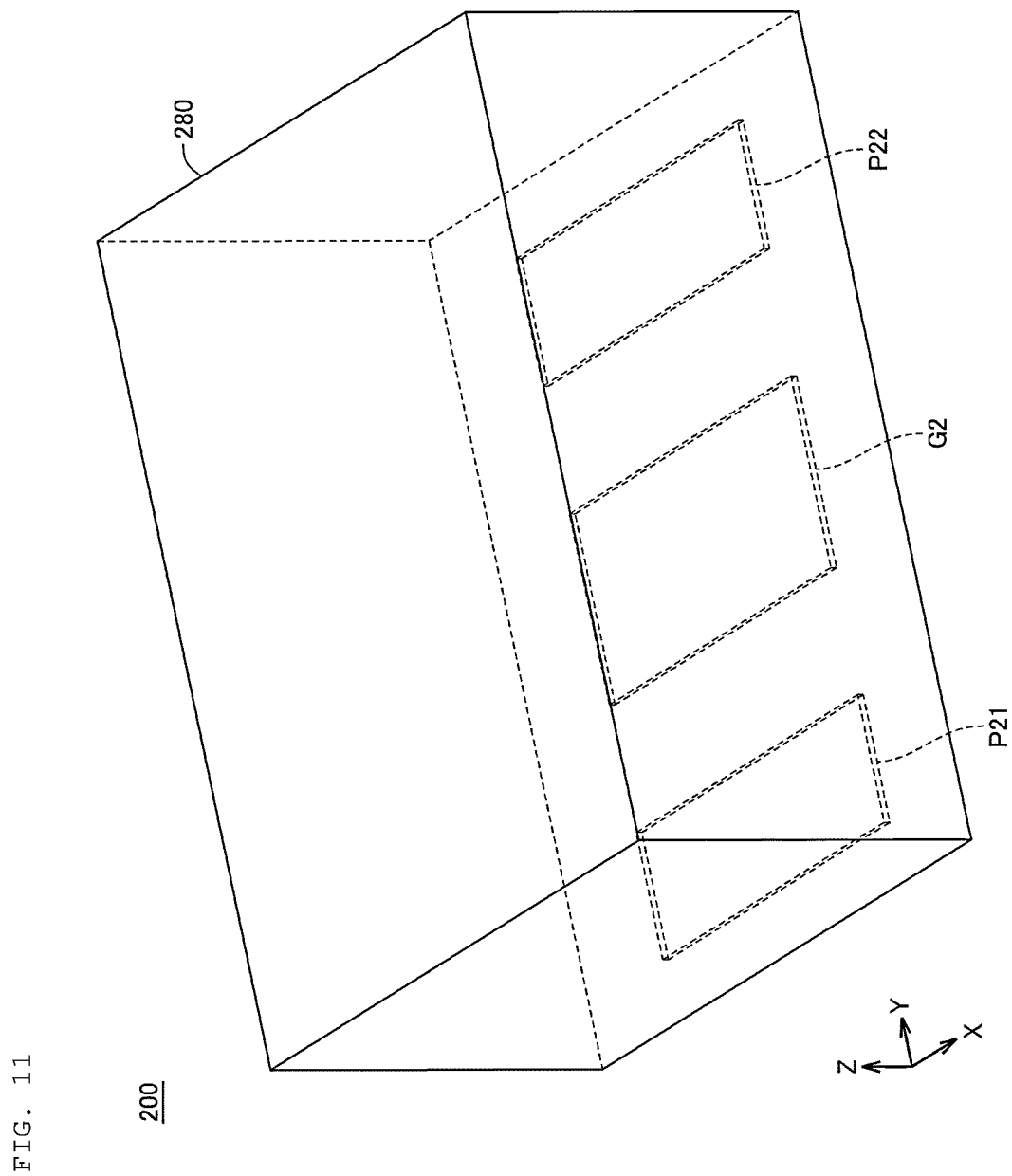
FIG. 11 is an external perspective view of the band pass filter of FIG. 10.

FIG. 11 is an external perspective view of the band pass filter 200 of FIG. 10. As illustrated in FIG. 11, the band pass filter 200 is preferably defined by a multilayer body 280 in which a plurality of dielectric layers are laminated in the Z-axis direction. The input/output terminals P21 and P22 and a ground terminal G2 are in or on a bottom surface of the multilayer body 280. The input/output terminals P21 and P22 and the ground terminal G2 are preferably, for example, a land grid array (LGA) terminal where plane electrodes are arranged in an orderly manner in or on the bottom surface of the multilayer body 280. The bottom surface of the multilayer body 280 is connected to a circuit board (not illustrated).

Figure 12:
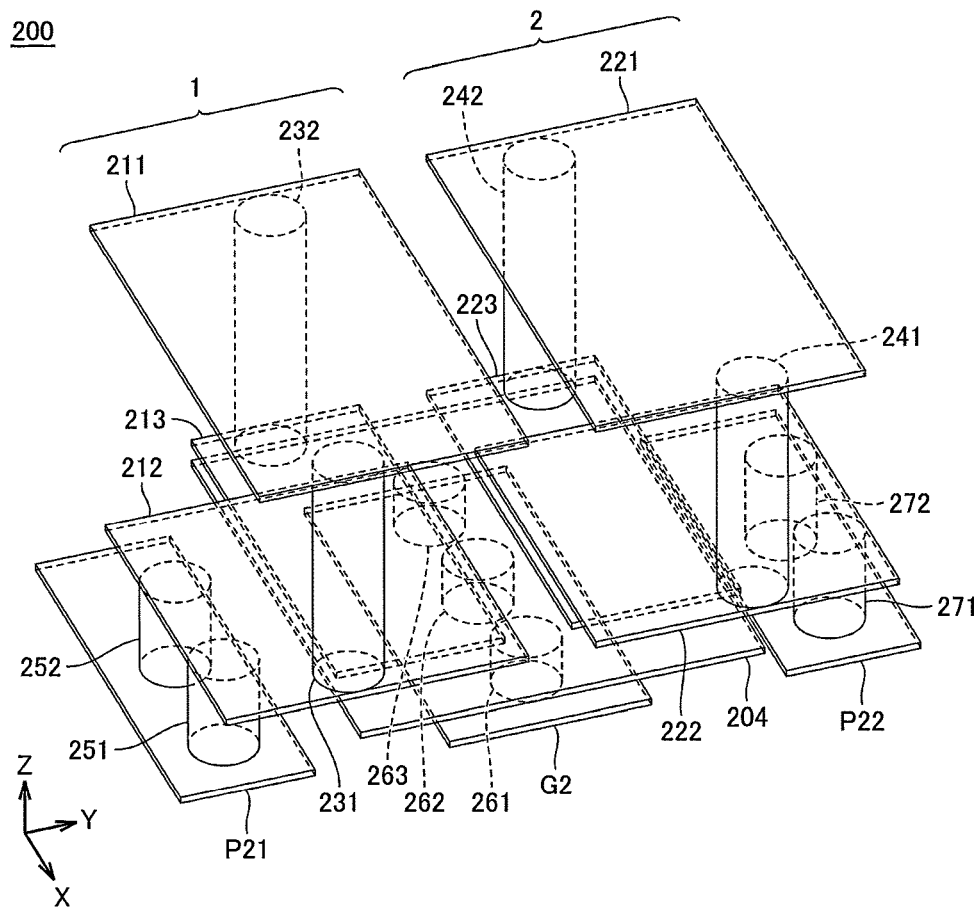
FIG. 12 is an external perspective view of an electrode structure inside a multilayer body of FIG. 11.
Figure 13:
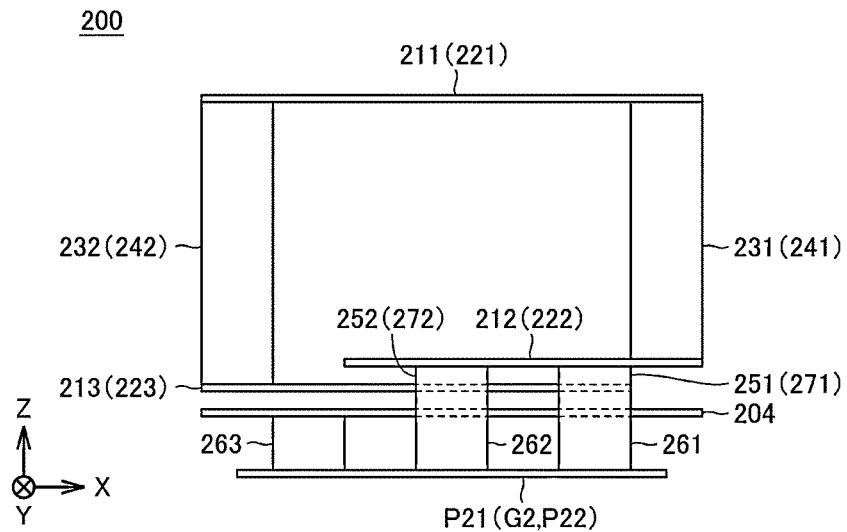
FIG. 13 is a view of the electrode structure of FIG. 12 when seen in a plan view from the Y-axis direction.
Figure 14:
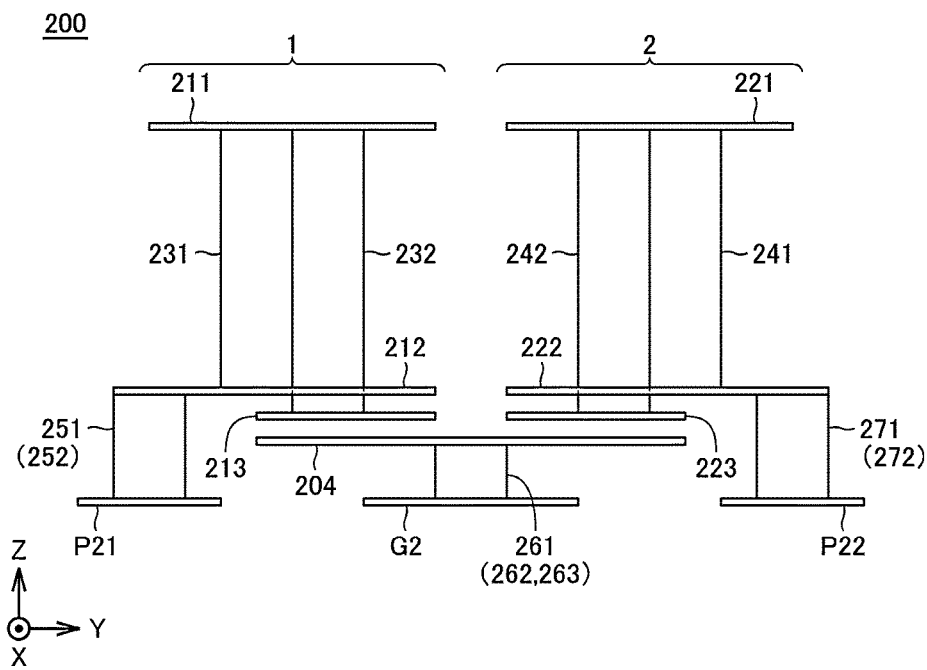
FIG. 14 is a view of the electrode structure of FIG. 12 when seen in a plan view from the X-axis direction.

FIG. 12 is an external perspective view of an electrode structure inside the multilayer body 280 of FIG. 11. FIG. 13 is a view of the electrode structure of FIG. 12 when seen in a plan view from the Y-axis direction. FIG. 14 is a view of the electrode structure of FIG. 12 when seen in a plan view from the X-axis direction. As illustrated in FIGS. 12 to 14, the band pass filter 200 is provided with a line electrode 211 (the first line electrode), a plane electrode 212 (the first plane electrode), a plane electrode 213 (the second plane electrode), a via conductor 231 (the first via conductor), and a via conductor 232 (the second via conductor). The band pass filter 200 is preferably further provided with a line electrode 221 (the first line electrode), a plane electrode 222 (the first plane electrode), a plane electrode 223 (the second plane electrode), a via conductor 241 (the first via conductor), and a via conductor 242 (the second via conductor). The band pass filter 200 is further provided with a ground electrode 204 (the third plane electrode) and via conductors 251, 252, 261, 262, 263, 271, and 272.

The plane electrode 213 is opposed to at least a portion of the plane electrode 212 in the Z-axis direction. The plane electrodes 212 and 213 define the capacitor 11. The plane electrode 212 is connected to the input/output terminal P21 by the via conductors 251 and 252.

The line electrode 211 extends in the X-axis direction. The via conductors 231 and 232 extend in the Z-axis direction from both end portions of the line electrode 211 to be connected to the plane electrodes 212 and 213, respectively. The via conductor 231, the line electrode 211, and the via conductor 232 define the inductor 10.

The plane electrode 213 is between the plane electrode 212 and the ground electrode 204 in the Z-axis direction. The ground electrode 204 is opposed to at least a portion of the plane electrode 213 in the Z-axis direction. The plane electrode 213 and the ground electrode 204 define the capacitor 12.

The plane electrode 223 is opposed to at least a portion of the plane electrode 222 in the Z-axis direction. The plane electrodes 222 and 223 define the capacitor 21. The plane electrode 222 is connected to the input/output terminal P22 by the via conductors 271 and 272.

The line electrode 221 extends in the X-axis direction. The via conductors 241 and 242 extend in the Z-axis direction from both end portions of the line electrode 221 to be connected to the plane electrodes 222 and 223, respectively. The via conductor 241, the line electrode 221, and the via conductor 242 define the inductor 20.

The plane electrode 223 is between the plane electrode 222 and the ground electrode 204 in the Z-axis direction. The ground electrode 204 is opposed to at least a portion of the plane electrode 223 in the Z-axis direction. The plane electrode 223 and the ground electrode 204 define the capacitor 22.

The ground electrode 204 is connected to the ground terminal G2 by each of the via conductors 261 to 263 to be grounded. The via conductors 261 to 263 define the inductor LG.

Figure 15:
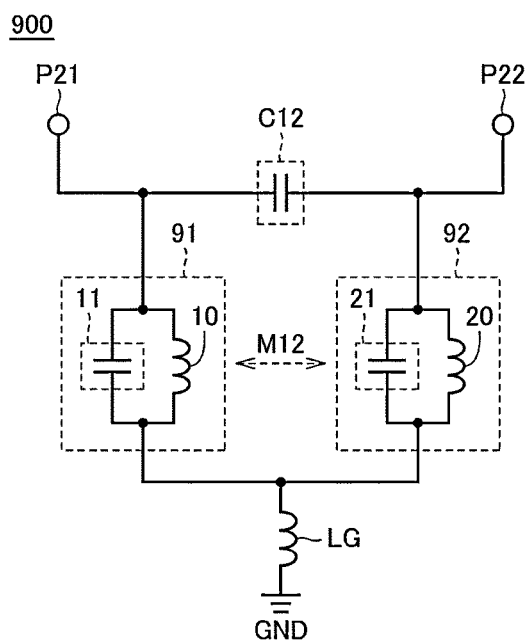
FIG. 15 is an equivalent circuit diagram of a band pass filter according to a comparative example of Preferred Embodiment 2 of the present invention.

FIG. 15 is an equivalent circuit diagram of a band pass filter 900 according to a comparative example of Preferred Embodiment 2. The band pass filter 900 has a configuration in which the LC resonators 1 and 2 of FIG. 10 are replaced by LC parallel resonators 91 and 92, respectively. The LC parallel resonator 91 has a configuration in which the capacitor 12 is removed from the LC resonator 1. The LC parallel resonator 92 has a configuration in which the capacitor 22 is removed from the LC resonator 2. Since other configurations are the same or similar, description is not repeated. As illustrated in FIG. 15, the inductor 10 and the capacitor 11 are grounded. The inductor 20 and the capacitor 21 are grounded.

Similarly to the band pass filter 200, the band pass filter 900 is preferably a multilayer body in which a plurality of dielectric layers are laminated in the Z-axis direction. Since an external perspective view of the band pass filter 900 is the same or similar to the external perspective view of the band pass filter 200 illustrated in FIG. 11, description is not repeated. An electrode structure inside the multilayer body is described with reference to FIGS. 16 to 18.

Figure 16:
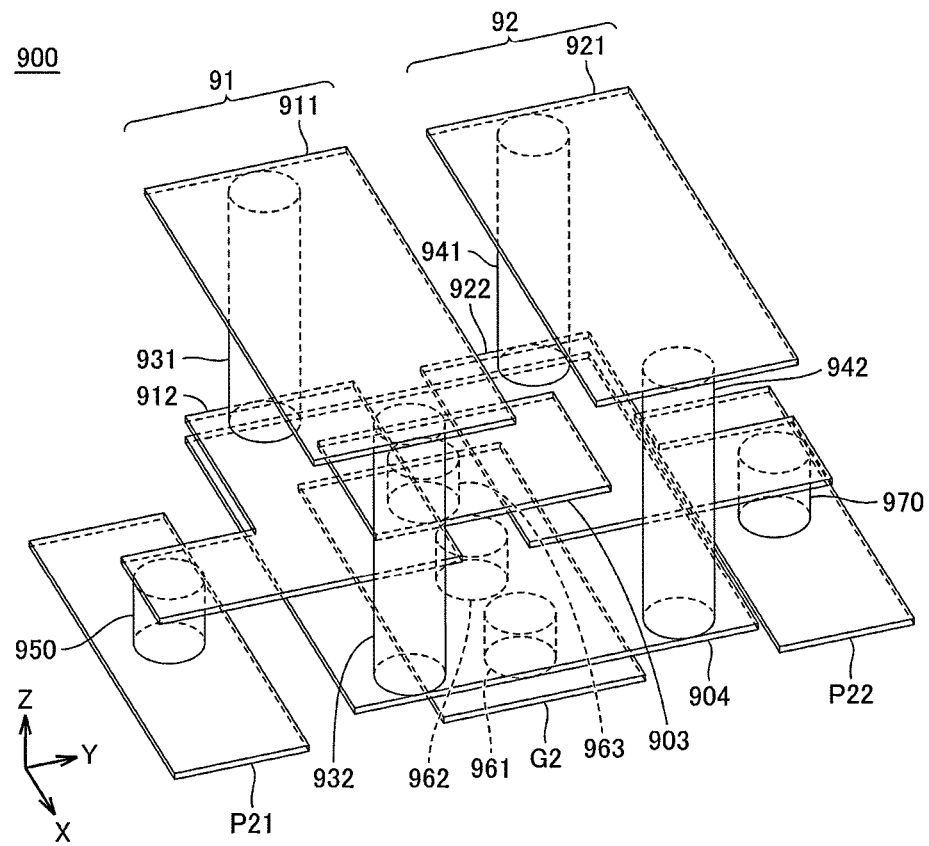
FIG. 16 is an external perspective view of an electrode structure of the band pass filter of FIG. 15.
Figure 17:
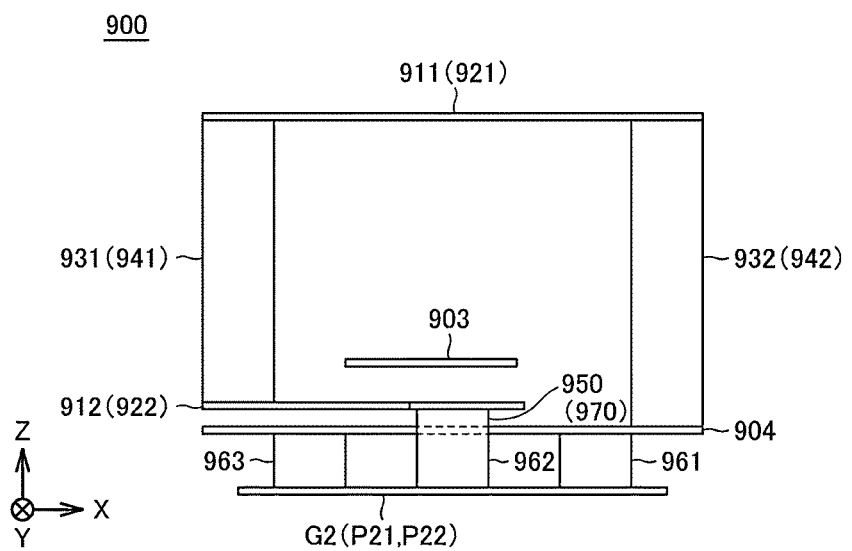
FIG. 17 is a view of the electrode structure of FIG. 16 when seen in a plan view from the Y-axis direction.
Figure 18:
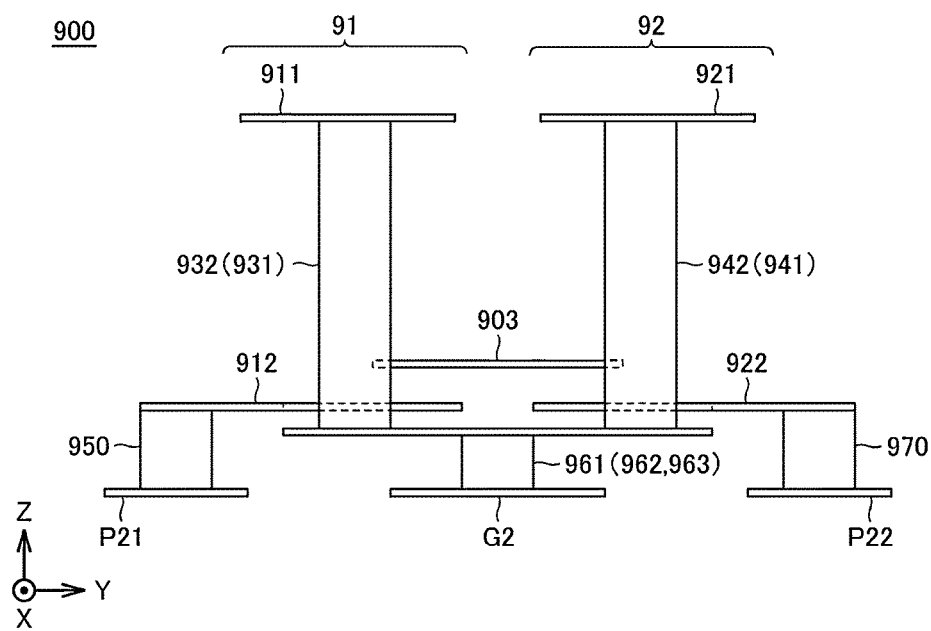
FIG. 18 is a view of the electrode structure of FIG. 16 when seen in a plan view from the X-axis direction.

FIG. 16 is an external perspective view of the electrode structure of the band pass filter 900 of FIG. 15. FIG. 17 is a view of the electrode structure of FIG. 16 when seen in a plan view from the Y-axis direction. FIG. 18 is a view of the electrode structure of FIG. 16 when seen in a plan view from the X-axis direction. As illustrated in FIGS. 16 to 18, the band pass filter 900 is provided with a line electrode 911, a plane electrode 912, and via conductors 931 and 932. The band pass filter 900 preferably further includes a line electrode 921, a plane electrode 922, and via conductors 941 and 942. The band pass filter 900 also preferably further includes a ground electrode 904, a plane electrode 903, and via conductors 950, 961, 962, 963, and 970.

The line electrode 911 extends in the X-axis direction. The via conductors 931 and 932 extend in the Z-axis direction from both end portions of the line electrode 911 to be connected to the plane electrode 912 and the ground electrode 904, respectively. The via conductor 931, the line electrode 911, and the via conductor 932 define the inductor 10.

The ground electrode 904 is opposed to at least a portion of the plane electrode 912 in the Z-axis direction. The plane electrode 912 and the ground electrode 904 define the capacitor 11. The plane electrode 912 is connected to the input/output terminal P21 by the via conductor 950.

The line electrode 921 extends in the X-axis direction. The via conductors 941 and 942 extend in the Z-axis direction from both end portions of the line electrode 921 to be connected to the plane electrode 922 and the ground electrode 904, respectively. The via conductor 941, the line electrode 921, and the via conductor 942 define the inductor 20.

The ground electrode 904 is opposed to at least a portion of the plane electrode 922 in the Z-axis direction. The plane electrode 922 and the ground electrode 904 define the capacitor 21. The plane electrode 922 is preferably connected to the input/output terminal P22 by the via conductor 970.

The plane electrode 903 is opposed to at least a portion of the plane electrode 912 and at least a portion of the plane electrode 922 in the Z-axis direction. The plane electrodes 912, 903, and 922 define the capacitor C12. The ground electrode 904 is connected to the ground terminal G2 by the via conductors 961 to 963 to be grounded. The via conductors 961 to 963 define the inductor LG.

Figure 19:
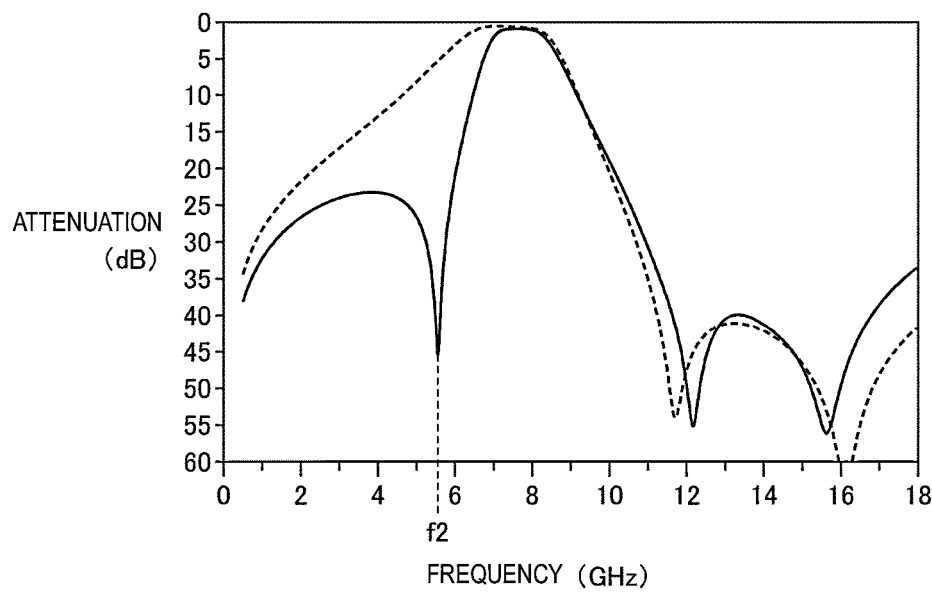
FIG. 19 is a diagram illustrating bandpass characteristics of the band pass filter of FIG. 10 (straight line) and bandpass characteristics of the band pass filter of FIG. 15 (dashed line) altogether.

FIG. 19 is a diagram illustrating bandpass characteristics of the band pass filter 200 of FIG. 10 (straight line) and bandpass characteristics of the band pass filter 900 of FIG. 15 (dashed line) altogether. As illustrated in FIG. 19, in the bandpass characteristics of the band pass filter 900, an attenuation pole does not occur in a frequency band on a lower-pass side of the pass band. On the other hand, in the bandpass characteristics of the band pass filter 200, an attenuation pole occurs at a frequency f2 lower than the pass band. In the band pass filter 200, steepness near the boundary of the pass band on the lower-pass side is improved by the attenuation pole compared to the band pass filter 900. That is, in the band pass filter 200, a function of the band pass filter to limit the frequency at which signals are passable to a desired frequency band is improved compared to the band pass filter 900.

In the band pass filter 200, the configuration in which the LC resonator is directly connected to the input/output terminal is described. The LC resonator is not always required to be directly connected to the input/output terminal, as long as it is electrically connected thereto. The LC resonator being electrically connected to the input/output terminal includes a capacitive coupling of the LC resonator to the input/output terminal.

Figure 20:
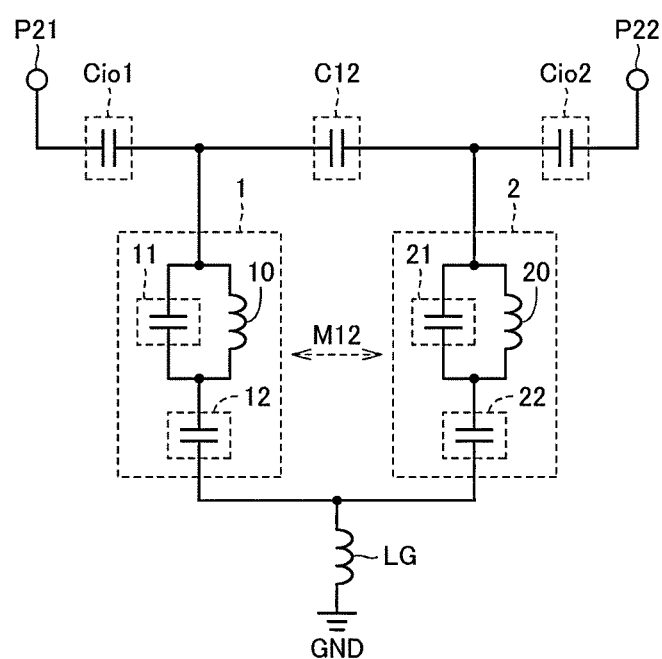
FIG. 20 is an equivalent circuit diagram of a band pass filter according to a modification of Preferred Embodiment 2 of the present invention.

FIG. 20 is an equivalent circuit diagram of a band pass filter 200A according to a modification of Preferred Embodiment 2. The band pass filter 200A has a configuration in which capacitors Cio1 and Cio2 are added to the band pass filter 200 of FIG. 10. Since other configurations are the same or similar, description is not repeated.

As illustrated in FIG. 20, the capacitor Cio1 is connected between the input/output terminal P21 and a connection node of the inductor 10 and the capacitor 11. That is, the first plane electrode included in the capacitor 11 is electrically connected to the input/output terminal P21. The capacitor Cio1 indicates a capacitive coupling which occurs between the input/output terminal P21 and the LC resonator 1.

The capacitor Cio2 is connected between the input/output terminal P22 and a connection node of the inductor 20 and the capacitor 21. That is, the first plane electrode included in the capacitor 21 is electrically connected to the input/output terminal P22. The capacitor Cio2 indicates a capacitive coupling which occurs between the input/output terminal P22 and the LC resonator 2.

As described above, the LC filter according to Preferred Embodiments 2 and the modification can reduce or prevent an increase in size of the LC filter while improving the characteristics of the LC filter.

Preferred Embodiment 3

Figure 21:
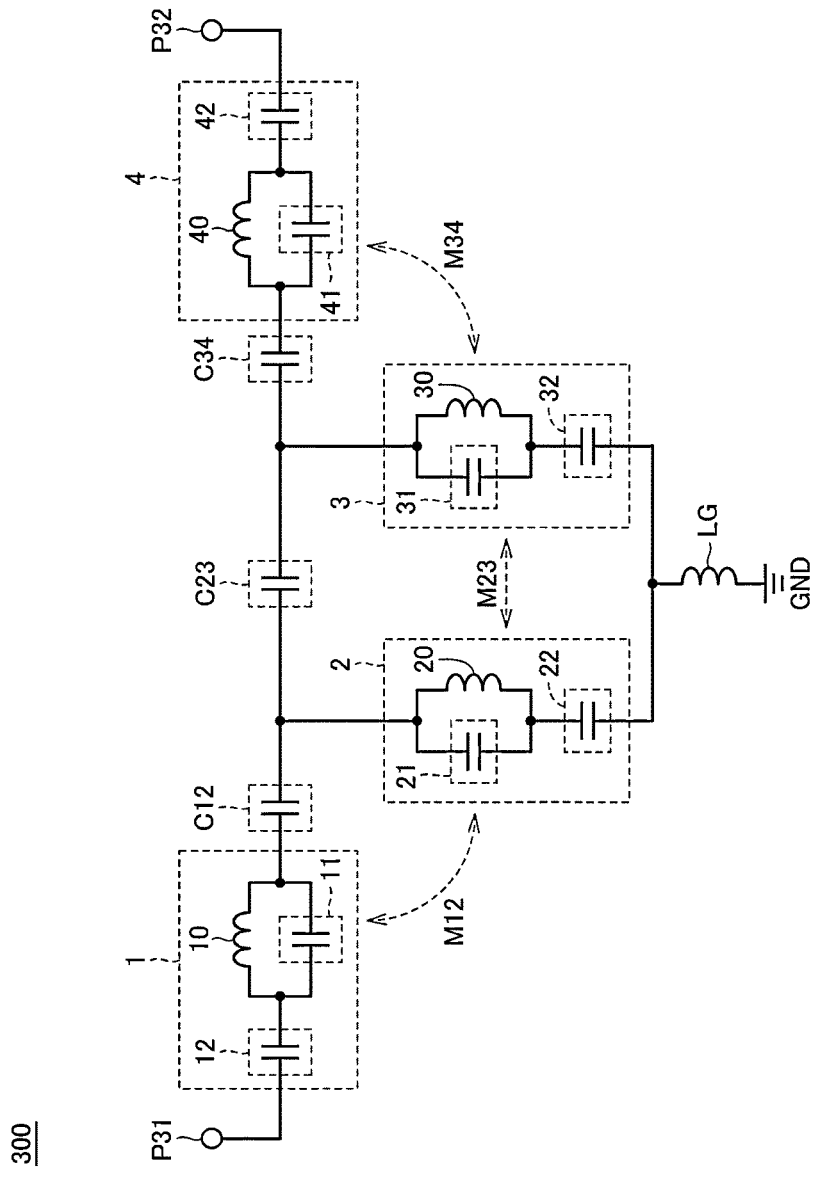
FIG. 21 is an equivalent circuit diagram of a band pass filter as one example of an LC filter according to Preferred Embodiment 3 of the present invention.

FIG. 21 is an equivalent circuit diagram of a band pass filter 300 as one example of an LC filter according to Preferred Embodiment 3 of the present invention. As illustrated in FIG. 21, the band pass filter 300 is preferably provided with an input/output terminal P31 (the first terminal), an input/output terminal P32 (the second terminal), an LC resonator 1 (the first LC resonator), LC resonators 2 and 3, an LC resonator 4 (the second LC resonator), and capacitors C12, C23, and C34. The band pass filter 300 is a four-stage band pass filter.

The capacitor 12 of the LC resonator 1 is connected to the input/output terminal P31. The capacitor C12 is connected between the LC resonators 1 and 2. The capacitor C12 indicates a capacitive coupling which occurs between the LC resonators 1 and 2. The capacitor C23 is connected between the LC resonators 2 and 3. The capacitor C23 indicates a capacitive coupling which occurs between the LC resonators 2 and 3. The capacitor C34 is connected between the LC resonators 3 and 4. The capacitor C34 indicates a capacitive coupling which occurs between the LC resonators 3 and 4. A capacitor 42 of the LC resonator 4 is connected to the input/output terminal P32.

The magnetic coupling M12 occurs between the LC resonators 1 and 2. A magnetic coupling M23 occurs between the LC resonators 2 and 3. A magnetic coupling M34 occurs between the LC resonators 3 and 4.

The LC resonators 1 and 2 have the same configuration as the LC resonator 1B of FIG. 9 and the LC resonator 1A of FIG. 1, respectively. The capacitor 12 and the inductor 10 are connected in series between the input/output terminals P31 and P32 in this order. The capacitor 12 indicates a capacitive coupling between the input/output terminal P31 and the LC parallel resonator defined by the inductor 10 and the capacitor 11.

The LC resonator 3 includes an inductor 30 and capacitors 31 and 32. The LC resonator 4 includes an inductor 40 and capacitors 41 and 42. The LC resonators 3 and 4 have the same configurations as the LC resonator 1A of FIG. 1 and the LC resonator 1B of FIG. 9, respectively. That is, the inductor 30 and the capacitors 31 and 32 correspond to the inductor 10A and the capacitors 11A and 12A, respectively. The inductor 40 and the capacitors 41 and 42 correspond to the inductor 10A and the capacitors 11A and 12A, respectively. The capacitor C42 and the inductor 40 are connected in series between the input/output terminals P32 and P31 in this order. The capacitor 42 indicates a capacitive coupling between the input/output terminal P32 and the LC parallel resonator defined by the inductor 40 and the capacitor 41.

Figure 22:
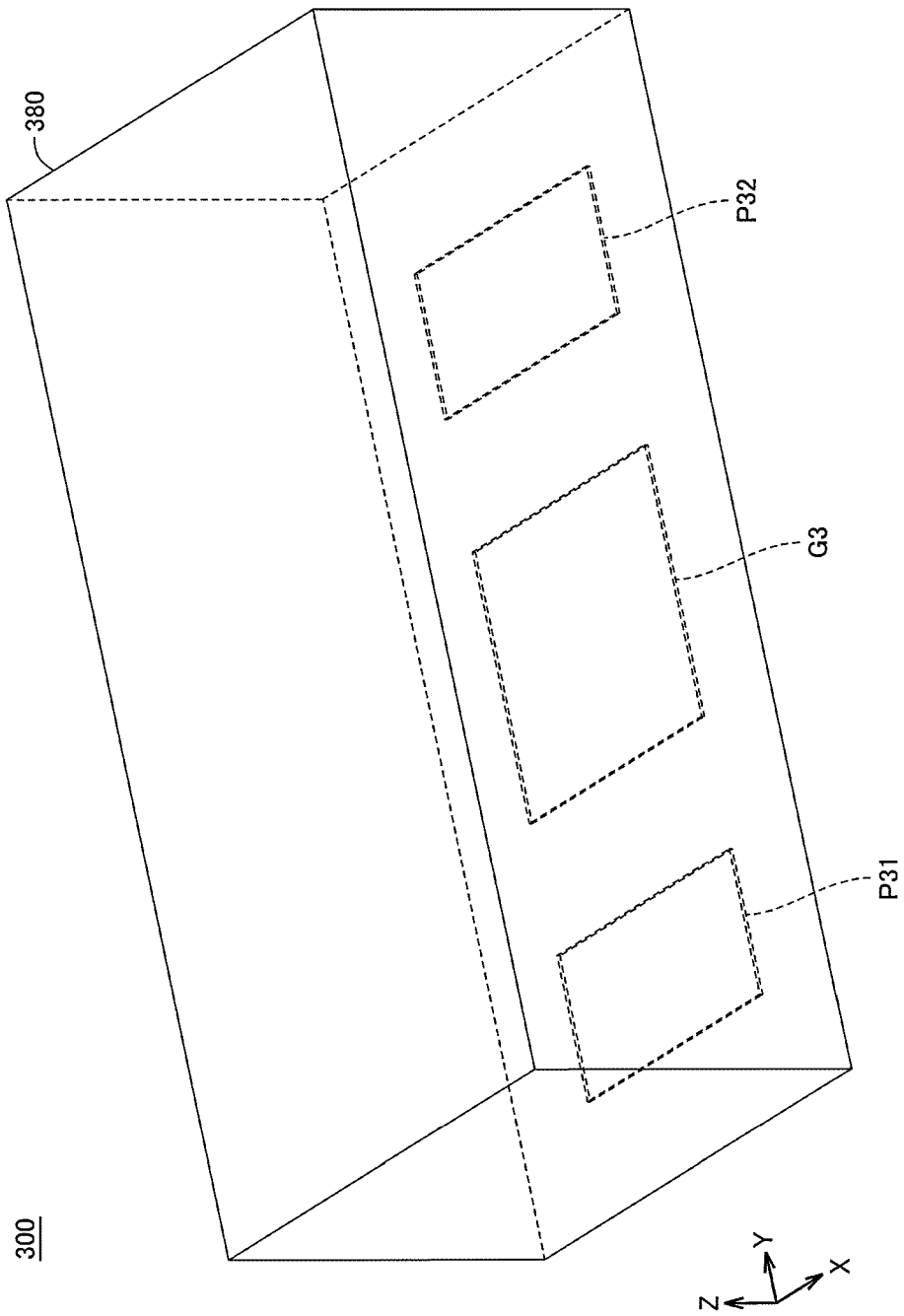
FIG. 22 is an external perspective view of the band pass filter of FIG. 21.

FIG. 22 is an external perspective view of the band pass filter 300 of FIG. 21. As illustrated in FIG. 22, the band pass filter 300 is preferably defined by a multilayer body 380 in which a plurality of dielectric layers are laminated in the Z-axis direction. The input/output terminals P31 and P32 and a ground terminal G3 are in or on a bottom surface of the multilayer body 380. The input/output terminals P31 and P32 and the ground terminal G3 are, for example, a land grid array (LGA) terminal where plane electrodes are arranged in an orderly manner in or on the bottom surface of the multilayer body 380. The bottom surface of the multilayer body 380 is connected to a circuit board (not illustrated).

Figure 23:
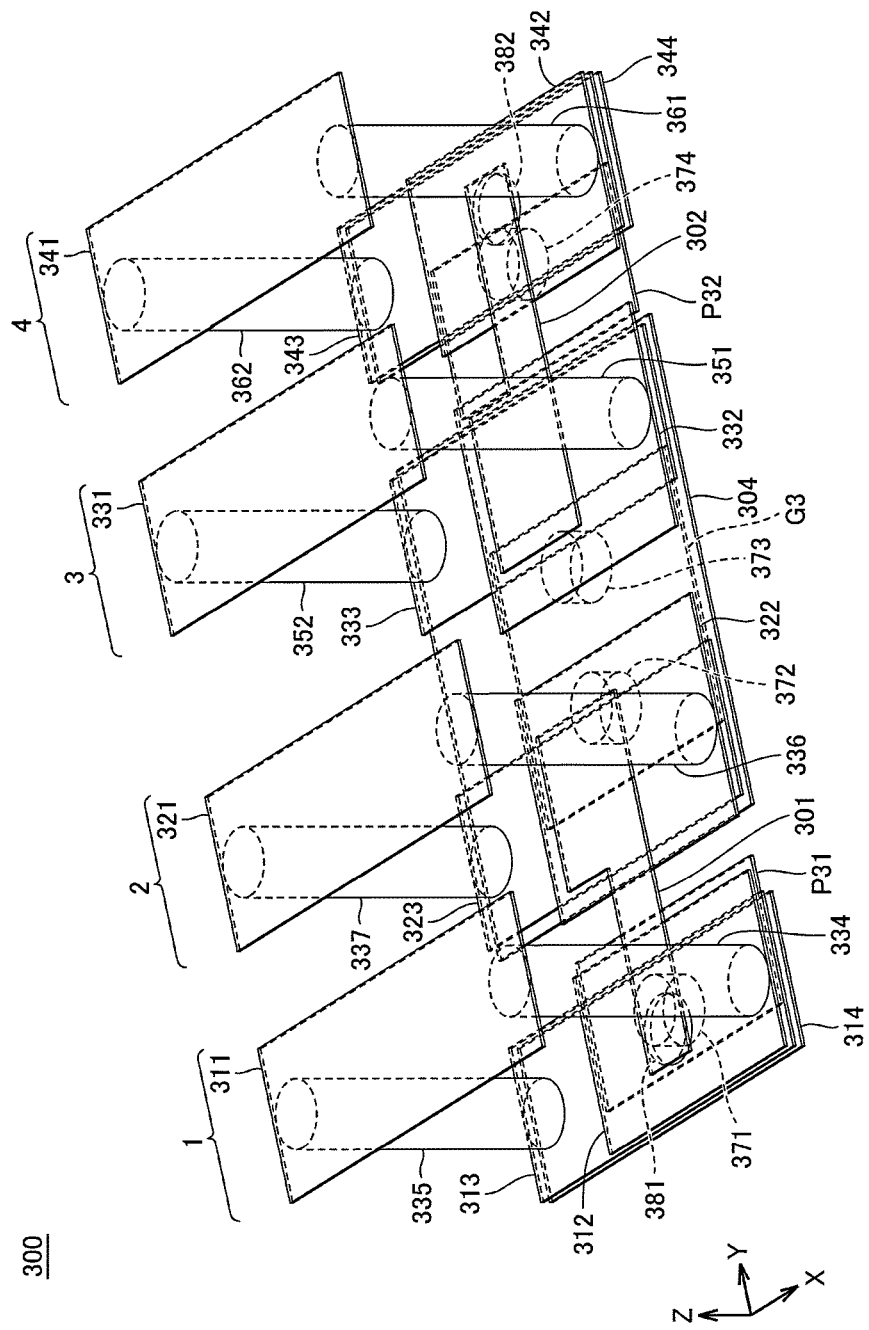
FIG. 23 is an external perspective view of an electrode structure inside a multilayer body of FIG. 22.
Figure 24:
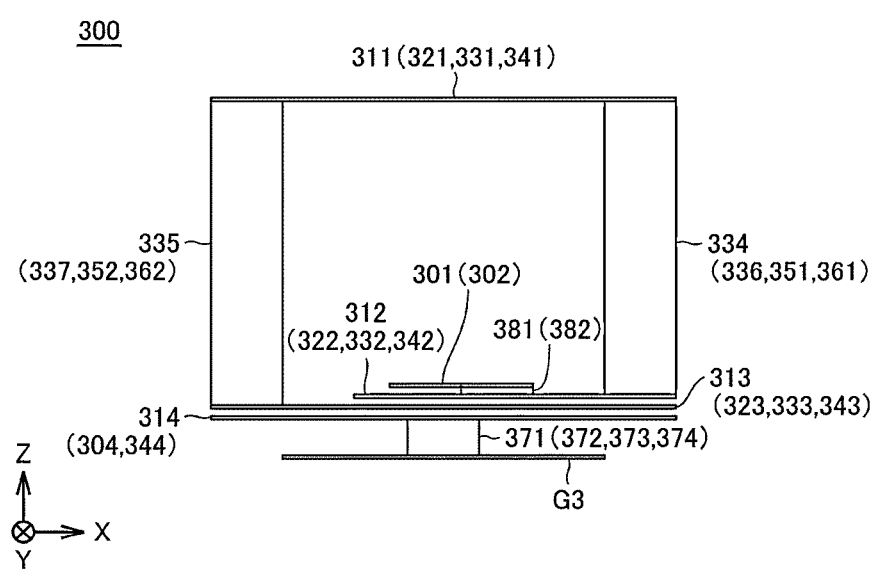
FIG. 24 is a view of the electrode structure of FIG. 23 when seen in a plan view from the Y-axis direction.
Figure 25:
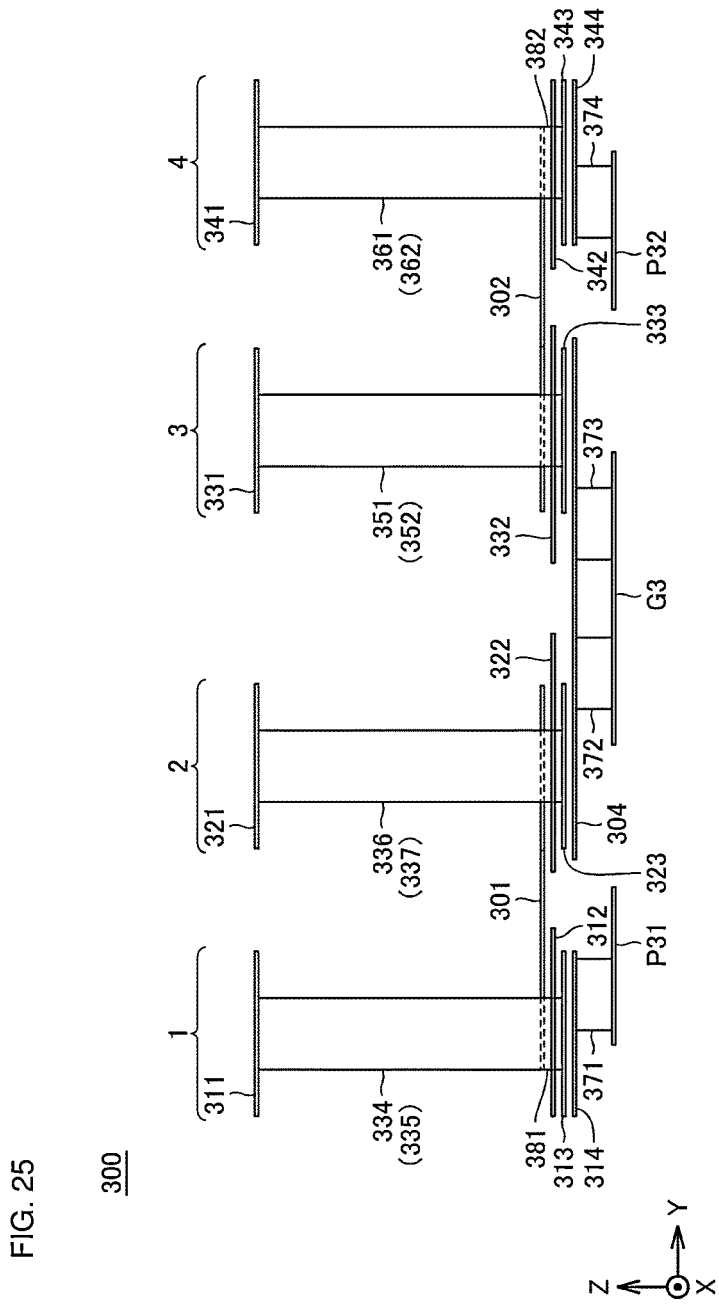
FIG. 25 is a view of the electrode structure of FIG. 23 when seen in a plan view from the X-axis direction.

FIG. 23 is an external perspective view of an electrode structure inside the multilayer body 380 of FIG. 22. FIG. 24 is a view of the electrode structure of FIG. 23 when seen in a plan view from the Y-axis direction. FIG. 25 is a view of the electrode structure of FIG. 23 when seen in a plan view from the X-axis direction. As illustrated in FIGS. 23 to 25, the band pass filter 300 preferably includes a line electrode 311 (the first line electrode), a plane electrode 312 (the first plane electrode), a plane electrode 313 (the second plane electrode), a plane electrode 314 (the third plane electrode), a via conductor 334 (the first via conductor), and a via conductor 335 (the second via conductor). The band pass filter 300 preferably further includes a line electrode 321 (the first line electrode), a plane electrode 322 (the first plane electrode), a plane electrode 323 (the second plane electrode), a via conductor 336 (the first via conductor), and a via conductor 337 (the second via conductor). The band pass filter 300 also preferably further includes a line electrode 331 (the first line electrode), a plane electrode 332 (the first plane electrode), a plane electrode 333 (the second plane electrode), a via conductor 351 (the first via conductor), and a via conductor 352 (the second via conductor). The band pass filter 300 preferably further includes a line electrode 341 (the first line electrode), a plane electrode 342 (the first plane electrode), a plane electrode 343 (the second plane electrode), a plane electrode 344 (the third plane electrode), a via conductor 361 (the first via conductor), and a via conductor 362 (the second via conductor). The band pass filter 300 also preferably includes a ground electrode 304 (the third plane electrode), plane electrodes 301 and 302, and via conductors 371, 372, 373, 374, 381, and 382.

The plane electrode 313 is opposed to at least a portion of the plane electrode 312 in the Z-axis direction. The plane electrodes 312 and 313 define the capacitor 11.

The line electrode 311 extends in the X-axis direction. The via conductors 334 and 335 extend in the Z-axis direction from both end portions of the line electrode 311 to be connected to the plane electrodes 312 and 313, respectively. The via conductor 334, the line electrode 311, and the via conductor 335 define the inductor 10.

The plane electrode 313 is between the plane electrodes 312 and 314 in the Z-axis direction. The plane electrode 314 is opposed to at least a portion of the plane electrode 313 in the Z-axis direction. The plane electrodes 313 and 314 define the capacitor 12. The plane electrode 314 is connected to the input/output terminal P31 by the via conductor 371.

The plane electrode 323 is opposed to at least a portion of the plane electrode 322 in the Z-axis direction. The plane electrodes 322 and 323 define the capacitor 21.

The line electrode 321 extends in the X-axis direction. The via conductors 336 and 337 extend in the Z-axis direction from both end portions of the line electrode 321 to be connected to the plane electrodes 322 and 323, respectively. The via conductor 336, the line electrode 321, and the via conductor 337 define the inductor 20.

The plane electrode 323 is between the plane electrode 322 and the ground electrode 304 in the Z-axis direction. The ground electrode 304 is opposed to at least a portion of the plane electrode 323 in the Z-axis direction. The plane electrode 323 and the ground electrode 304 define the capacitor 22.

The plane electrode 301 is connected to the plane electrode 312 by the via conductor 381. The plane electrode 301 is opposed to the plane electrode 322 in the Z-axis direction. The plane electrodes 301 and 322 define the capacitor 12.

The plane electrode 333 is opposed to at least a portion of the plane electrode 332 in the Z-axis direction. The plane electrodes 332 and 333 define the capacitor 31.

The line electrode 331 extends in the X-axis direction. The via conductors 351 and 352 extend in the Z-axis direction from both end portions of the line electrode 331 to be connected to the plane electrodes 332 and 333, respectively. The via conductor 351, the line electrode 331, and the via conductor 352 define the inductor 30.

The plane electrode 333 is between the plane electrode 332 and the ground electrode 304 in the Z-axis direction. The ground electrode 304 is opposed to at least a portion of the plane electrode 333 in the Z-axis direction. The plane electrode 333 and the ground electrode 304 define the capacitor 32.

The ground electrode 304 is connected to the ground terminal G3 by each of the via conductors 372 and 373 to be grounded. The via conductors 372 and 373 define the inductor LG.

The plane electrode 343 is opposed to at least a portion of the plane electrode 342 in the Z-axis direction. The plane electrodes 342 and 343 define the capacitor 41.

The line electrode 341 extends in the X-axis direction. The via conductors 361 and 362 extend in the Z-axis direction from both end portions of the line electrode 341 to be connected to the plane electrodes 342 and 343, respectively. The via conductor 361, the line electrode 341, and the via conductor 362 define the inductor 40.

The plane electrode 343 is between the plane electrodes 342 and 344 in the Z-axis direction. The plane electrode 344 is opposed to at least a portion of the plane electrode 343 in the Z-axis direction. The plane electrodes 343 and 344 define the capacitor 42. The plane electrode 344 is connected to the input/output terminal P32 by the via conductor 374.

The plane electrode 302 is connected to the plane electrode 342 by the via conductor 382. The plane electrode 302 is opposed to the plane electrode 332 in the Z-axis direction. The plane electrodes 302 and 332 define the capacitor C34.

Figure 26:
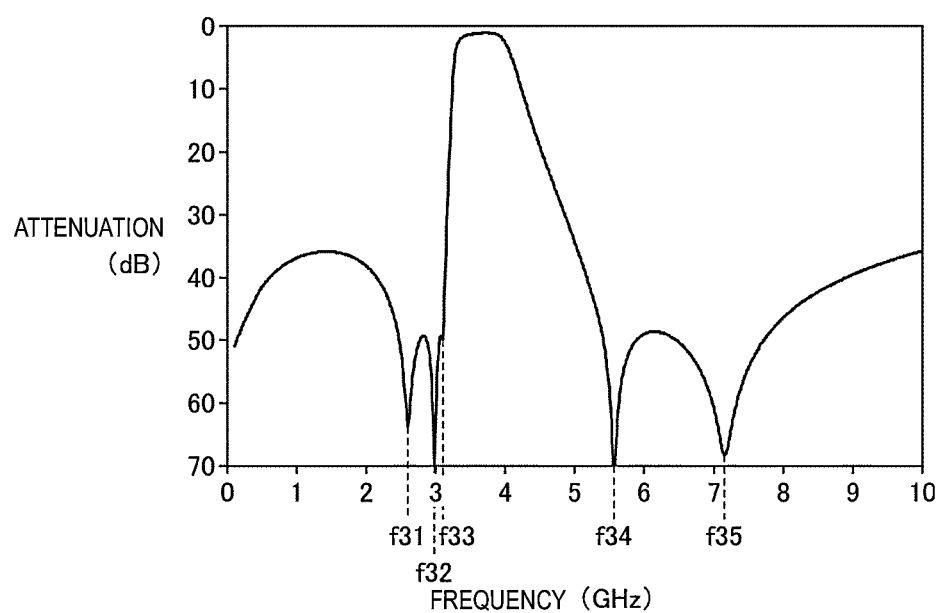
FIG. 26 is a diagram illustrating bandpass characteristics of the band pass filter of FIG. 21.

FIG. 26 is a diagram illustrating bandpass characteristics of the band pass filter 300 of FIG. 21. As illustrated in FIG. 26, attenuation poles occur at frequencies f31 and f32 (>f31) and f33 (>f32) lower than the pass band and at frequencies f34 and f35 (>f34) higher than the pass band.

Figure 27:
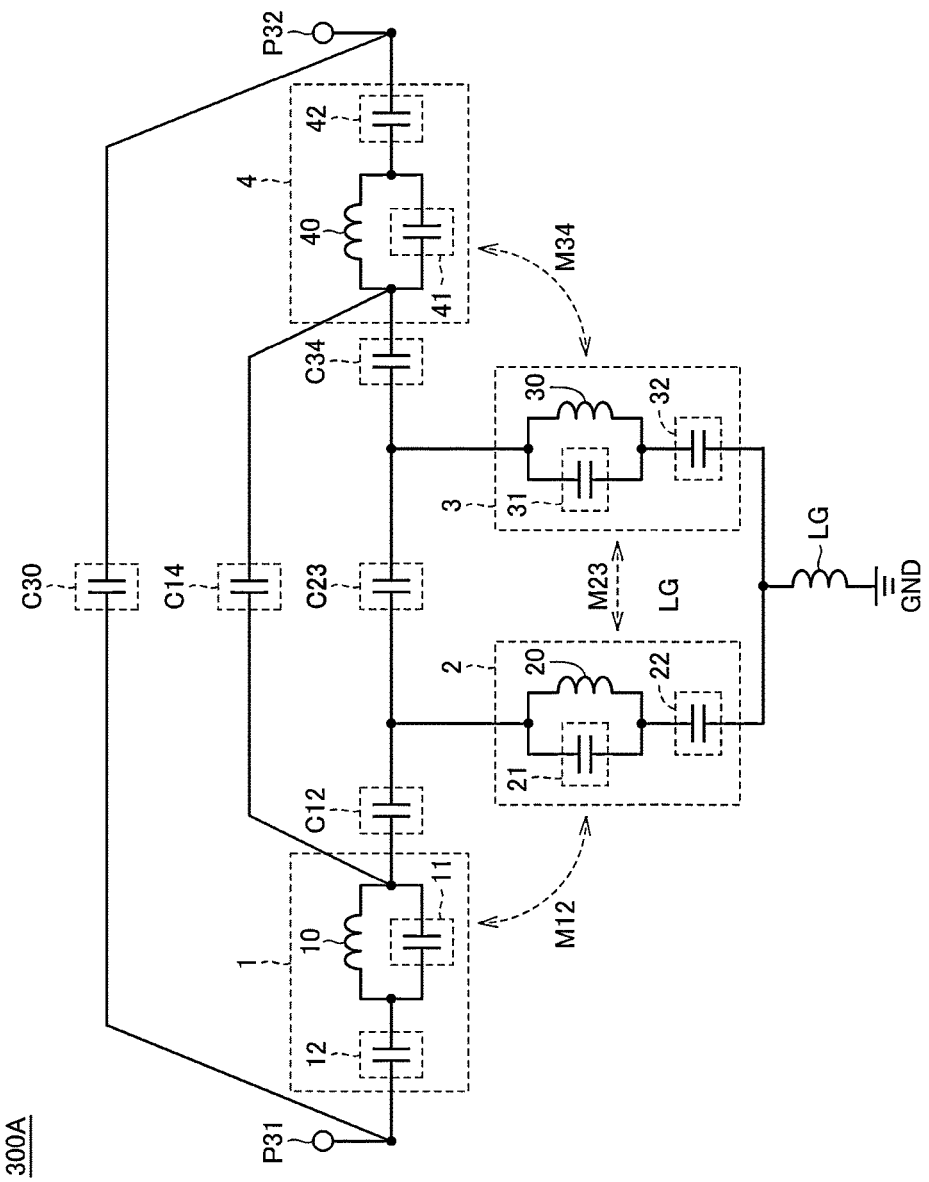
FIG. 27 is an equivalent circuit diagram of a band pass filter according to a modification of Preferred Embodiment 3 of the present invention.

The capacitive coupling which occurs between configurations included in the band pass filter is not limited to a capacitive coupling which occurs between adjacent configurations in an equivalent circuit like the capacitive coupling indicated by each of the capacitors 12, C12, C23, C34, and 42 of FIG. 21. In the band pass filter defined as a multilayer body of a plurality of dielectric layers, a capacitive coupling may also be provided between configurations which are not adjacent to each other in an equivalent circuit. FIG. 27 is an equivalent circuit diagram of a band pass filter 300A according to a modification of Preferred Embodiment 3. The band pass filter 300A has a configuration in which capacitors C30 and C14 are added to the band pass filter 300 of FIG. 21. Since other configurations are the same or similar, description is not repeated.

As illustrated in FIG. 27, the capacitor C30 is connected between the input/output terminals P31 and P32. The capacitor C30 indicates a capacitive coupling which occurs between the input/output terminals P31 and P32. The capacitor C14 is connected between the LC resonators 1 and 4. The capacitor C14 indicates a capacitive coupling which occurs between the LC resonators 1 and 4.

As described above, the LC filter according to Preferred Embodiment 3 and the modification can reduce or prevent an increase in size of the LC filter while improving the characteristics of the LC filter.

Preferred Embodiment 4

In Preferred Embodiment 3, the configuration in which the LC resonator electrically connected to the input/output terminal is not grounded is described. In Preferred Embodiment 4 of the present invention, a configuration in which the LC resonator electrically connected to the input/output terminal is also grounded similarly to the other LC resonator is described.

Figure 28:
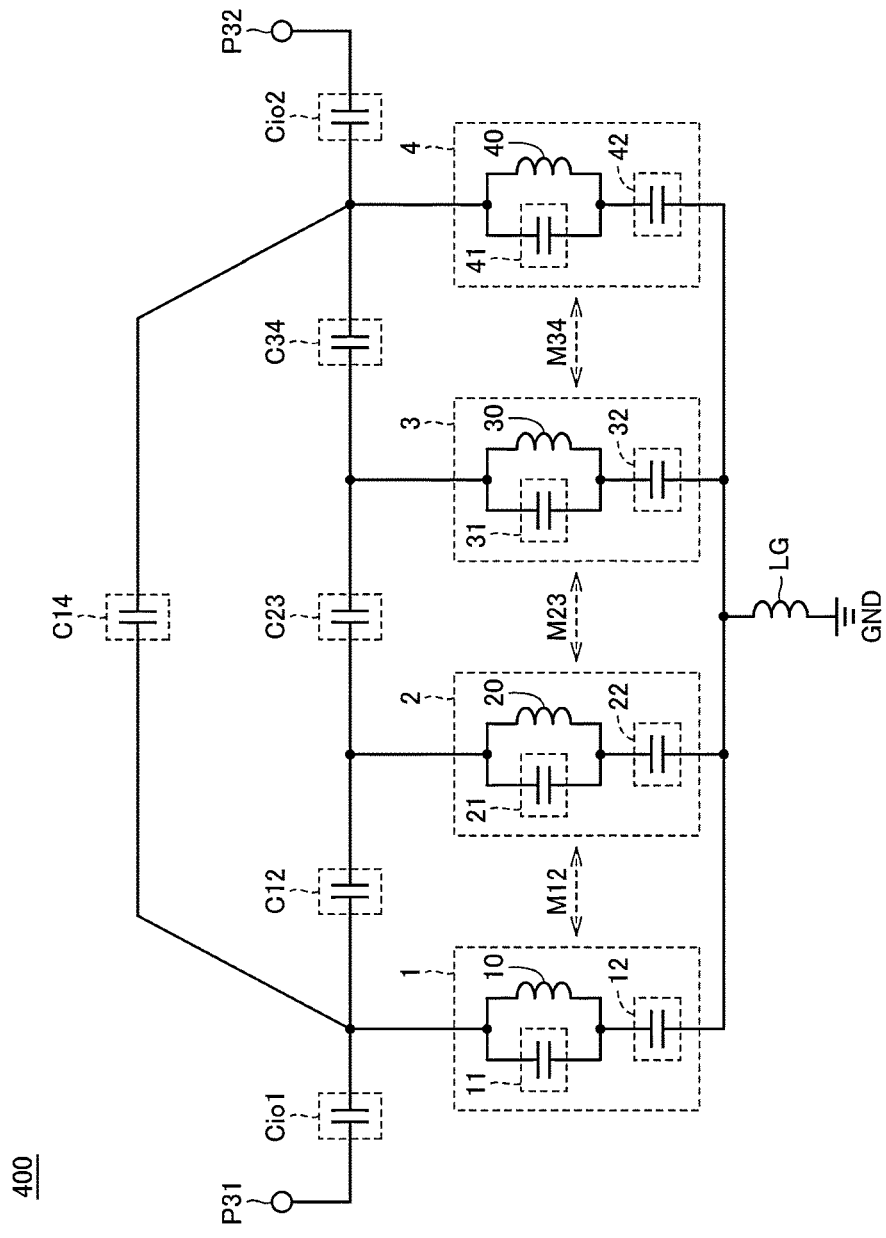
FIG. 28 is an equivalent circuit diagram of a band pass filter according to Preferred Embodiment 4 of the present invention.

FIG. 28 is an equivalent circuit diagram of a band pass filter 400 according to Preferred Embodiment 4. The band pass filter 400 has a configuration in which the LC resonators 1 and 4 of the band pass filter 300 of FIG. 21 are grounded, and the capacitors Cio1, C14, and Cio2 are added to the LC resonators 1 and 4 of the band pass filter 300. Since other configurations are the same or similar, description is not repeated.

As illustrated in FIG. 28, the capacitors 12 and 42 are grounded. The capacitor Cio1 is connected between the input/output terminal P31 and the LC resonator 1. The capacitor Cio1 indicates a capacitive coupling which occurs between the input/output terminal P31 and the LC resonator 1. The capacitor Cio2 is connected between the input/output terminal P32 and the LC resonator 4. The capacitor Cio2 indicates a capacitive coupling which occurs between the input/output terminal P32 and the LC resonator 4. The capacitor C14 is connected between the LC resonators 1 and 4. The capacitor C14 indicates a capacitive coupling which occurs between the LC resonators 1 and 4.

Figure 29:
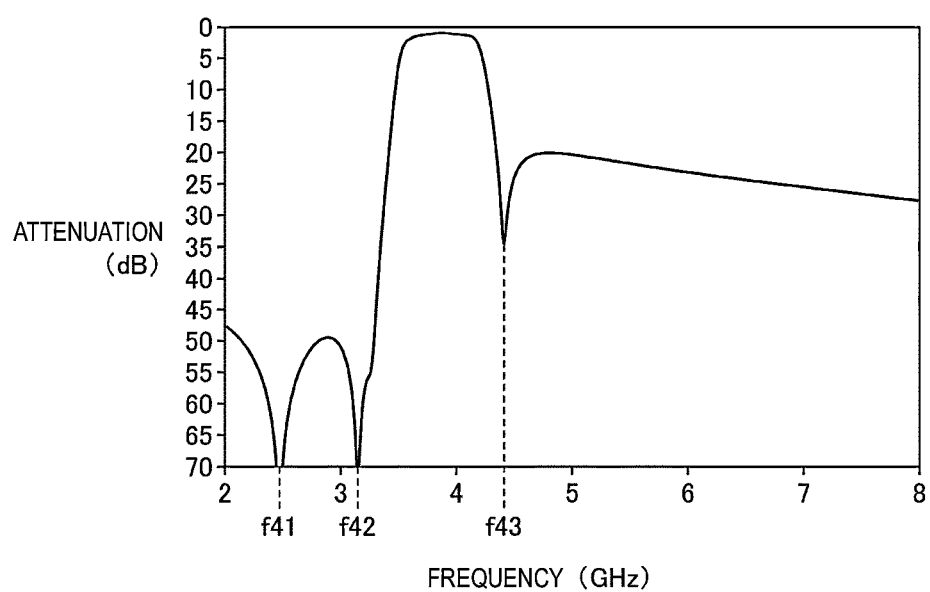
FIG. 29 is a diagram illustrating bandpass characteristics of the band pass filter of FIG. 28.

FIG. 29 is a diagram illustrating bandpass characteristics of the band pass filter 400 of FIG. 28. As illustrated in FIG. 29, attenuation poles occur at frequencies f41 and f42 (>f41) lower than the pass band and at a frequency f43 higher than the pass band.

Figure 30:
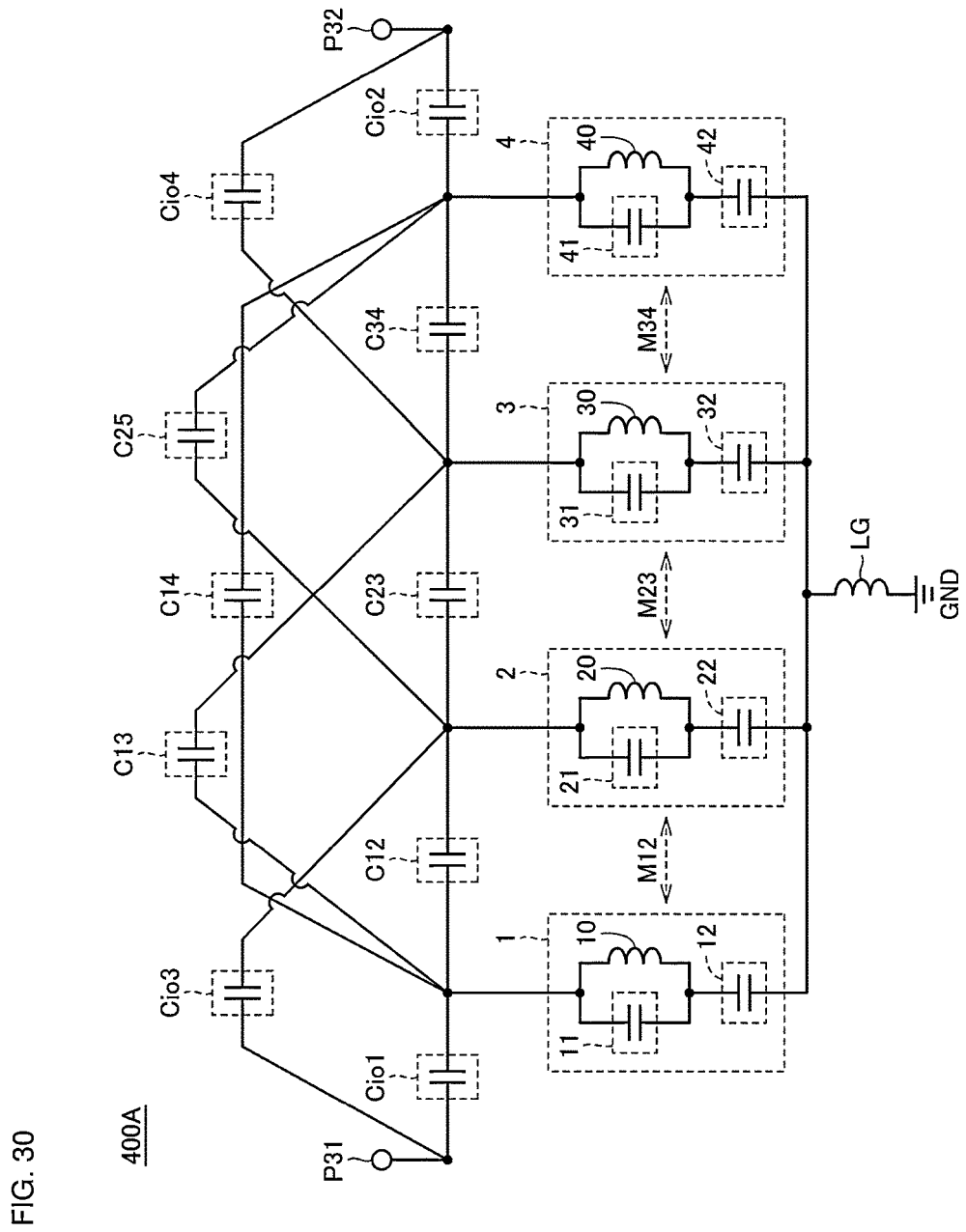
FIG. 30 is an equivalent circuit diagram of a band pass filter according to a modification of Preferred Embodiment 4 of the present invention.

In the band pass filter defined as a multilayer body of a plurality of dielectric layers, a capacitive coupling may occur between various configurations. The capacitive coupling which occurs in the band pass filter is not limited to the capacitive coupling illustrated in FIG. 28. FIG. 30 is an equivalent circuit diagram of a band pass filter 400A according to a modification of Preferred Embodiment 4. The band pass filter 400A has a configuration in which capacitors Cio3, C13, C25, and Cio4 are added to the band pass filter 400 of FIG. 28. Since other configurations are the same or similar, description is not repeated.

As illustrated in FIG. 30, the capacitor Cio3 is connected between the input/output terminal P31 and the LC resonator 2. The capacitor Cio3 indicates a capacitive coupling which occurs between the input/output terminal P31 and the LC resonator 2. The capacitor C13 is connected between the LC resonators 1 and 3. The capacitor C13 indicates a capacitive coupling which occurs between the LC resonators 1 and 3. The capacitor C25 is connected between the LC resonators 2 and 5. The capacitor C25 indicates a capacitive coupling which occurs between the LC resonators 2 and 5. The capacitor Cio4 indicates a capacitive coupling which occurs between the input/output terminal P32 and the LC resonator 3.

As described, the LC filter according to Preferred Embodiment 4 and the modification can reduce or prevent an increase in size of the LC filter while improving the characteristics of the LC filter.

Preferred Embodiment 5

In Preferred Embodiment 4, the case is described in which each of the plurality of LC resonators included in the LC filter has the same configuration as the LC resonator according to Preferred Embodiment 1. In Preferred Embodiment 5 of the present invention, a case is described in which an LC filter includes the LC resonator according to Preferred Embodiment 1 and the LC parallel resonator according to the comparative example of Preferred Embodiment 1.

Figure 31:
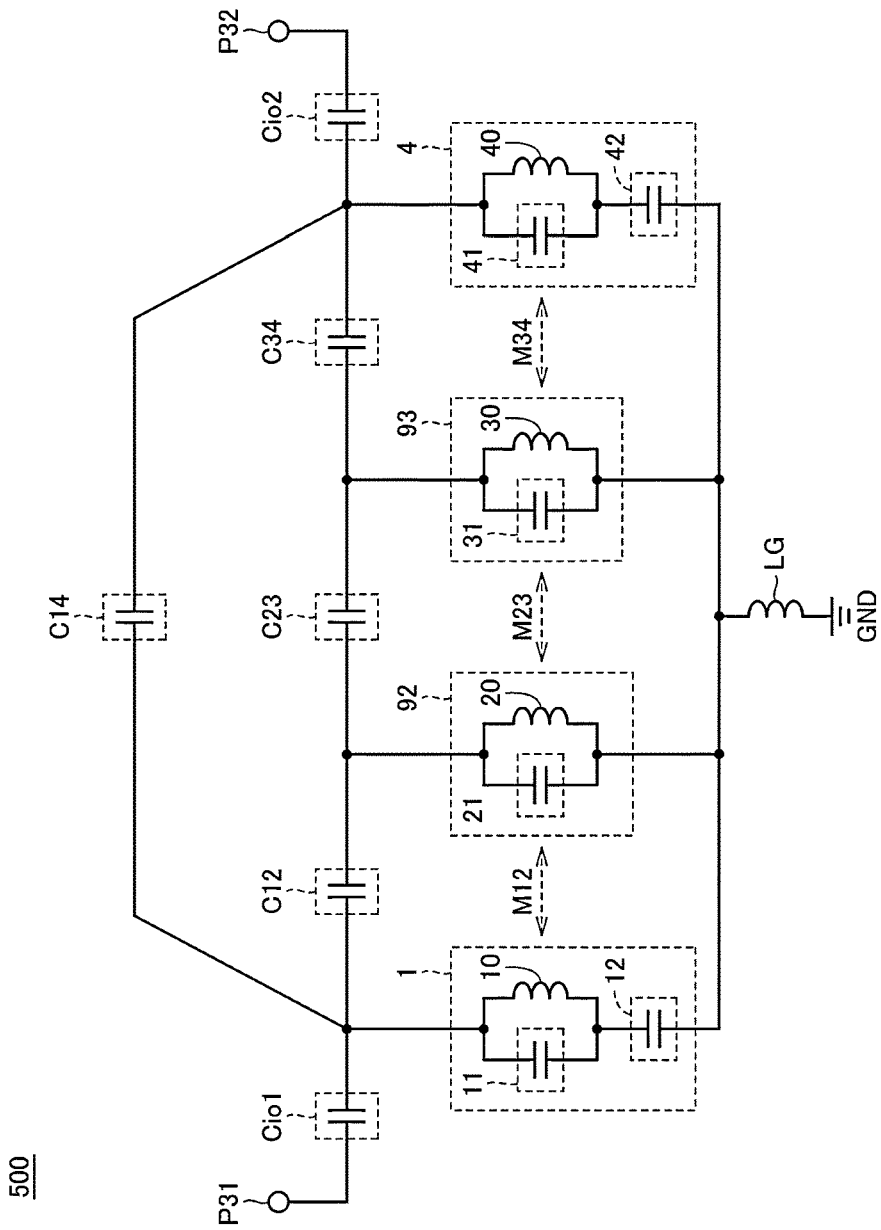
FIG. 31 is an equivalent circuit diagram of a band pass filter as one example of an LC filter according to Preferred Embodiment 5 of the present invention.

FIG. 31 is an equivalent circuit diagram of a band pass filter 500 as one example of an LC filter according to Preferred Embodiment 5. The band pass filter 500 preferably has a configuration in which the LC resonators 2 and 3 of the band pass filter 400 of FIG. 28 are replaced by LC parallel resonators 92 and 93, respectively. The LC parallel resonator 92 has a configuration in which the capacitor 22 is removed from the LC resonator 2. The LC parallel resonator 93 has a configuration in which the capacitor 32 is removed from the LC resonator 3. Since other configurations are the same or similar, description is not repeated.

Figure 32:
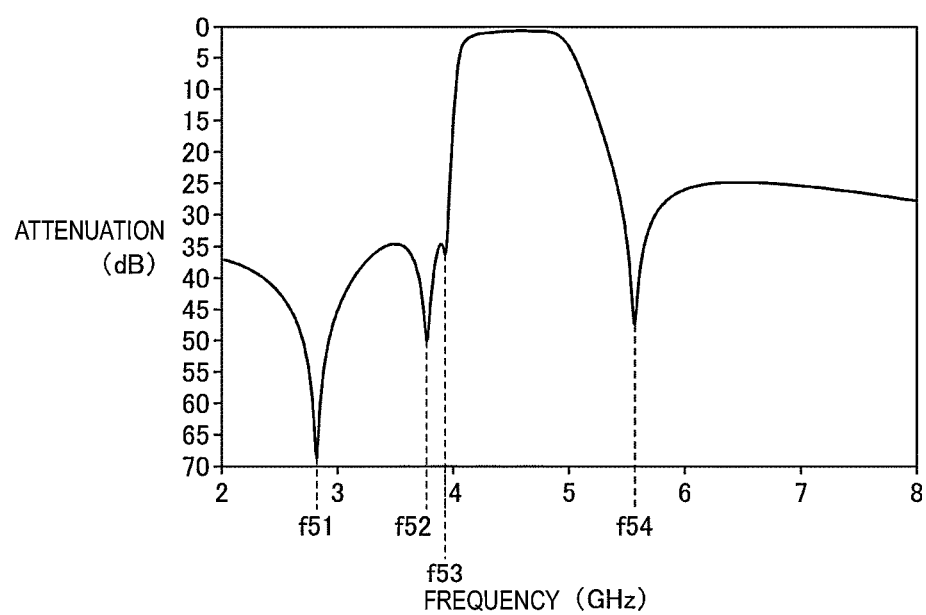
FIG. 32 is a diagram illustrating bandpass characteristics of the band pass filter of FIG. 31.

FIG. 32 is a diagram illustrating bandpass characteristics of the band pass filter 500 of FIG. 31. As illustrated in FIG. 32, attenuation poles occur at frequencies f51 and f52 (>f51) and f53 (>f52) lower than the pass band and at a frequency f54 higher than the pass band.

In the band pass filter according to Preferred Embodiment 5, the case is described in which the LC resonator electrically connected to the input/output terminal has the same or substantially the same configuration as the LC resonator according to Preferred Embodiment 1. The LC resonator according to Preferred Embodiment 1 is not always required to be connected to the input/output terminal, as long as the LC resonator is included in the band pass filter according to the present preferred embodiment.

Figure 33:
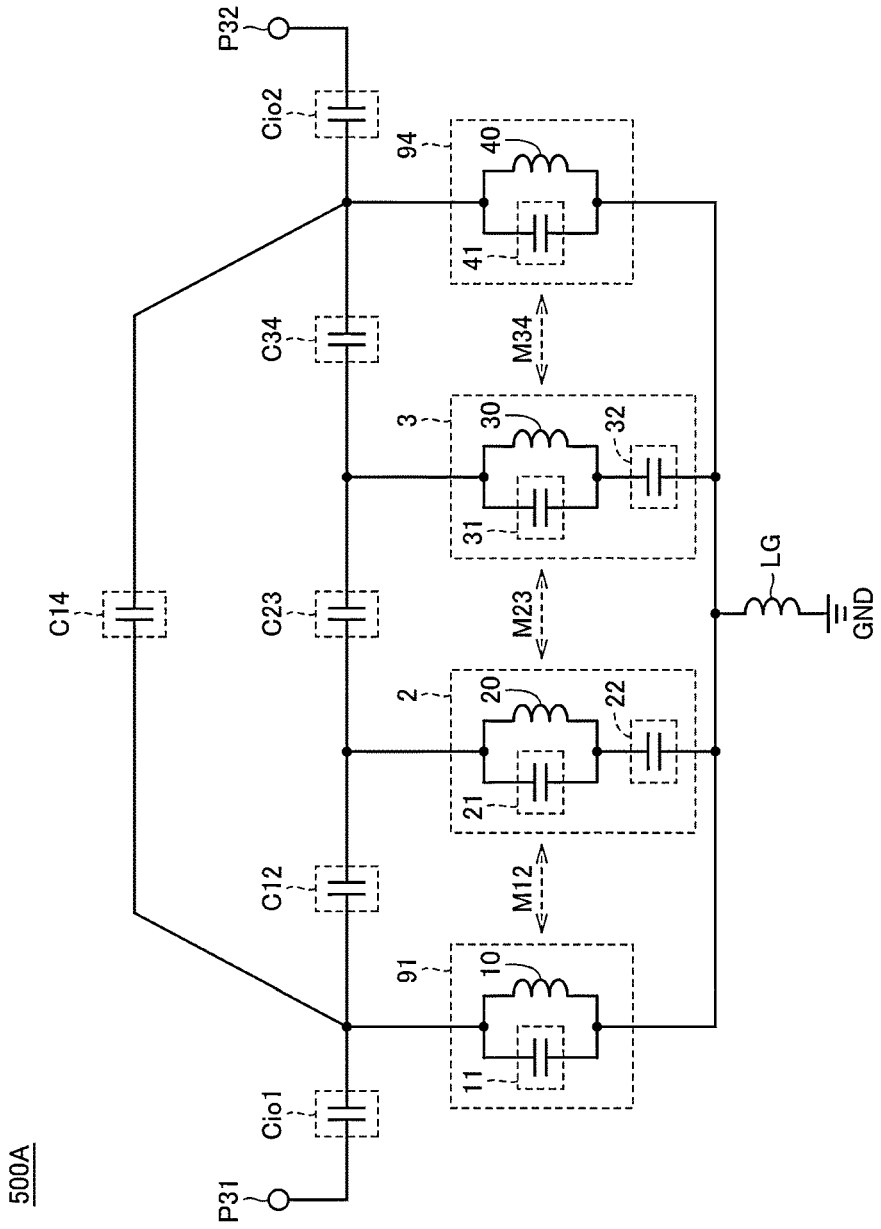
FIG. 33 is an equivalent circuit diagram of a band pass filter according to a modification of Preferred Embodiment 5 of the present invention.

FIG. 33 is an equivalent circuit diagram of a band pass filter 500A according to a modification of Preferred Embodiment 5. The band pass filter 500A has a configuration in which the LC resonators 1 and 4 of the band pass filter 400 of FIG. 28 are replaced by LC parallel resonators 91 and 94, respectively. The LC parallel resonator 91 preferably has a configuration in which the capacitor 12 is removed from the LC resonator 1. The LC parallel resonator 94 has a configuration in which the capacitor 42 is removed from the LC resonator 4. Since other configurations are the same or similar, description is not repeated.

Figure 34:
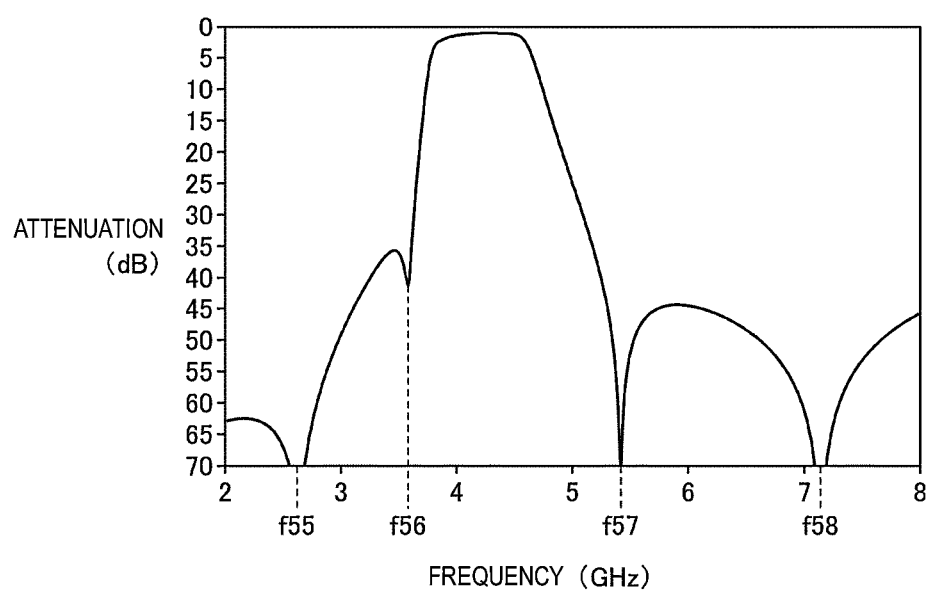
FIG. 34 is a diagram illustrating bandpass characteristics of the band pass filter of FIG. 33.

FIG. 34 is a diagram illustrating bandpass characteristics of the band pass filter 500A of FIG. 33. As illustrated in FIG. 33, attenuation poles occur at frequencies f55 and f56 (>f55) lower than the pass band and at frequencies f57 and f58 (>f57) higher than the pass band.

It is unnecessary that each of the plurality of LC resonators included in the band pass filter has the same or substantially the same configuration as the LC resonator according to Preferred Embodiment 1. By making one or some of the plurality of LC resonators to be an LC parallel resonator having a capacitor one less than the LC resonator according to Preferred Embodiment 1, a manufacturing cost and the size of the band pass filter can be reduced. By the band pass filter according to Preferred Embodiment 5 and the modification, the configuration of the band pass filter can be determined depending on desired characteristics, a manufacturing cost, and the size, which can improve a degree of freedom in designing the band pass filter.

The capacitive coupling which occurs in the band pass filter defined as a multilayer body of a plurality of dielectric layers is not limited to the capacitive coupling illustrated in FIGS. 31 and 33, which is similar to Preferred Embodiment 4.

As described above, the LC filter according to Preferred Embodiment 5 and the modification can reduce or prevent an increase in size of the LC filter and improve the degree of freedom in designing the LC filter while improving the characteristics of the LC filter.

Preferred Embodiment 6

Figure 35:
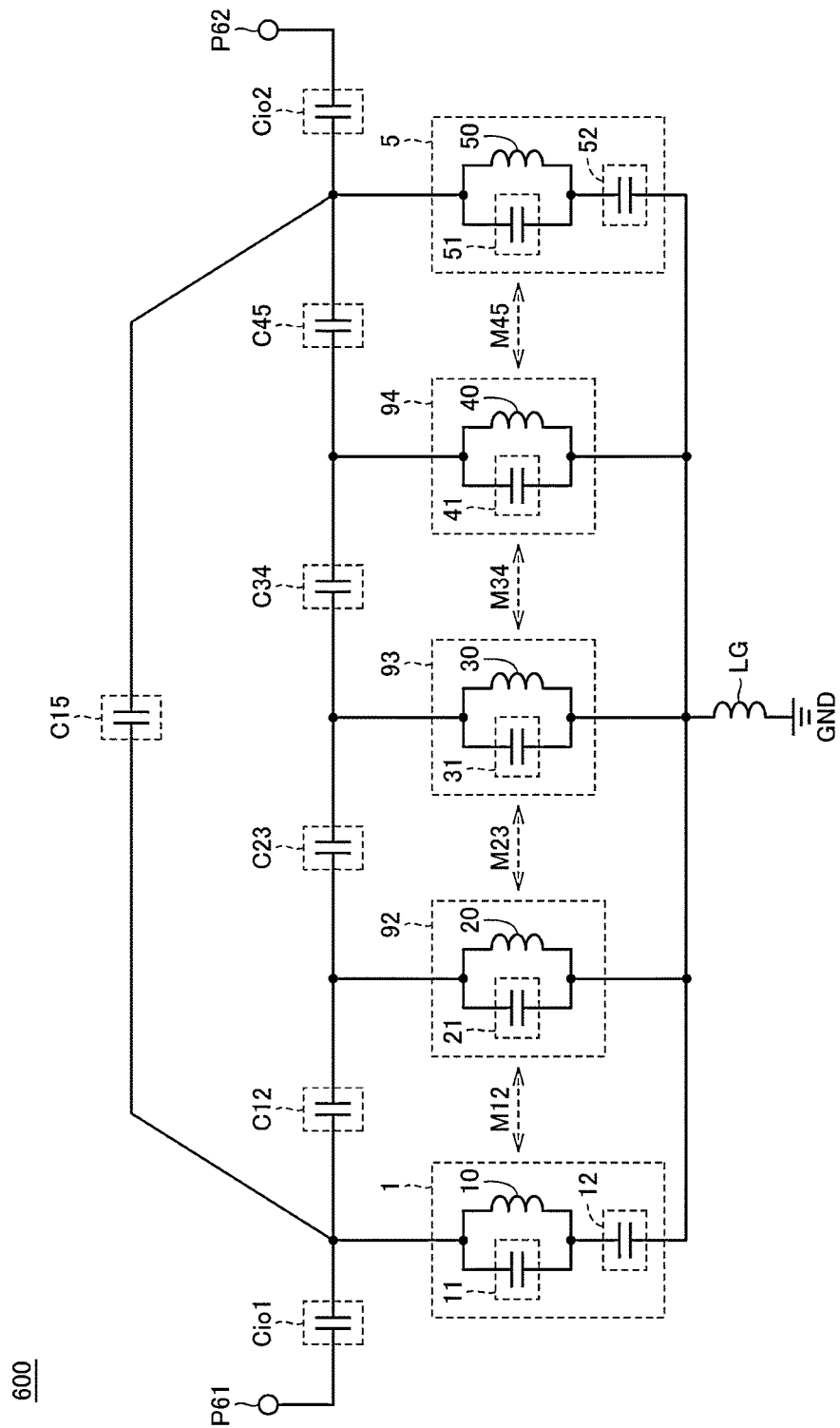
FIG. 35 is an equivalent circuit diagram of a band pass filter according to Preferred Embodiment 6 of the present invention.

FIG. 35 is an equivalent circuit diagram of a band pass filter 600 according to Preferred Embodiment 6 of the present invention. As illustrated in FIG. 35, the band pass filter 600 preferably includes an input/output terminal P61 (the first terminal), an input/output terminal P62 (the second terminal), the LC resonator 1 (the first LC resonator), the LC parallel resonators 92, 93, and 94, an LC resonator 5 (the second LC resonator), and capacitors Cio1, C12, C23, C34, C45, Cio2, and C15. The band pass filter 600 is preferably a five-stage band pass filter.

The capacitor Cio1 is connected between the input/output terminal P61 and the LC resonator 1. The capacitor Cio1 indicates a capacitive coupling which occurs between the input/output terminal P61 and the LC resonator 1.

The capacitor C12 is connected between the LC resonator 1 and the LC parallel resonator 92. The capacitor C12 indicates a capacitive coupling which occurs between the LC resonator 1 and the LC parallel resonator 92.

The capacitor C23 is connected between the LC parallel resonators 92 and 93. The capacitor C23 indicates a capacitive coupling which occurs between the LC parallel resonators 92 and 93.

The capacitor C34 is connected between the LC parallel resonators 93 and 94. The capacitor C34 indicates a capacitive coupling which occurs between the LC parallel resonators 93 and 94.

The capacitor C45 is connected between the LC parallel resonator 94 and the LC resonator 5. The capacitor C45 indicates a capacitive coupling which occurs between the LC parallel resonator 94 and the LC resonator 5.

The capacitor Cio2 is connected between the LC resonator 5 and the input/output terminal P62. The capacitor Cio2 indicates a capacitive coupling which occurs between the LC resonator 5 and the input/output terminal P62.

The capacitor C15 is connected between the LC resonators 1 and 5. The capacitor C15 indicates a capacitive coupling which occurs between the LC resonators 1 and 5.

The magnetic coupling M12 occurs between the LC resonators 1 and 2. The magnetic coupling M23 occurs between the LC resonators 2 and 3. The magnetic coupling M34 occurs between the LC resonators 3 and 4. A magnetic coupling M45 occurs between the LC resonators 4 and 5.

The LC resonator 1 is the same as or similar to the LC resonator 1 in Preferred Embodiments 4 and 5. The LC resonator 5 includes an inductor 50 and capacitors 51 and 52. The LC resonator 5 has the same configuration as the LC resonator 1A in FIG. 1. That is, the inductor 50 and the capacitors 51 and 52 correspond to the inductor 10A and the capacitors 11A and 12A, respectively.

The LC parallel resonator 92 preferably includes the inductor 20 and the capacitor 21. The LC parallel resonator 93 includes the inductor 30 and the capacitor 31. The LC parallel resonator 94 includes the inductor 40 and the capacitor 41. Each of the LC parallel resonators 92 to 94 has the same or substantially the same configuration as the LC parallel resonator 9A of FIG. 6. That is, the inductor 20 and the capacitor 21 correspond to the inductor 10A and the capacitor 11A, respectively. The inductor 30 and the capacitor 31 correspond to the inductor 10A and the capacitor 11A, respectively. The inductor 40 and the capacitor 41 correspond to the inductor 10A and the capacitor 11A, respectively.

Figure 36:
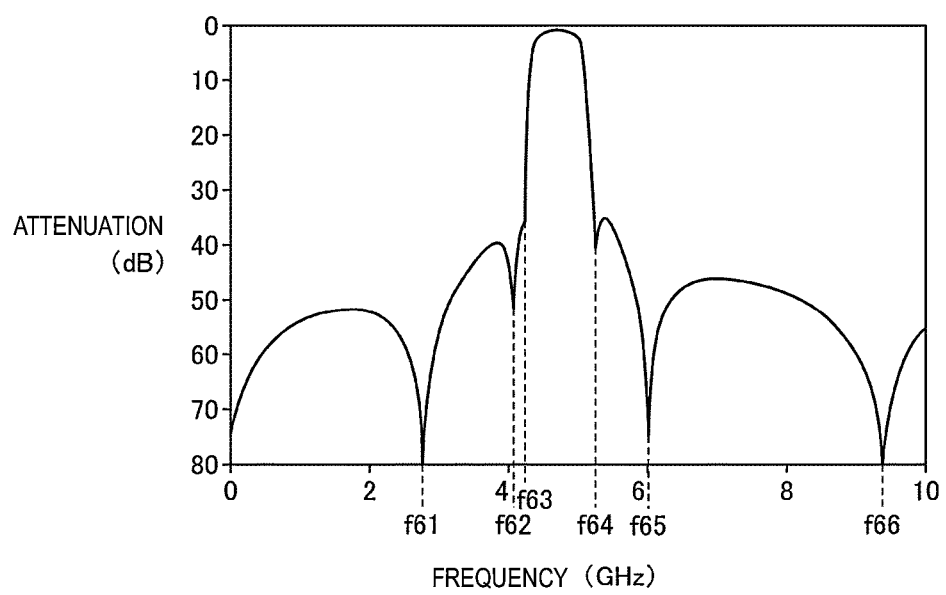
FIG. 36 is a diagram illustrating bandpass characteristics of the band pass filter of FIG. 35.

FIG. 36 is a diagram illustrating bandpass characteristics of the band pass filter 600 of FIG. 35. As illustrated in FIG. 36, attenuation poles occur at frequencies f61 and f62 (>f61) and f63 (>f62) lower than the pass band and at frequencies f64 and f65 (>f64) and f66 (>f65) higher than the pass band.

The capacitive coupling which occurs in the band pass filter defined as a multilayer body of a plurality of dielectric layers is not limited to the capacitive coupling illustrated in FIG. 35, which is similar to Preferred Embodiments 4 and 5.

As described above, the LC filter according to Preferred Embodiment 6 can reduce or prevent an increase in size of the LC filter and improve the degree of freedom in designing the LC filter while improving the characteristics of the LC filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC resonator comprising:
a first plane electrode;
a second plane electrode opposed to at least a portion of the first plane electrode in a specific direction;
a first line electrode;
a first via conductor and a second via conductor extending from the first line electrode in the specific direction to be connected to the first plane electrode and the second plane electrode, respectively; and
a third plane electrode opposed to at least a portion of the second plane electrode in the specific direction; wherein
the second plane electrode is between the first plane electrode and the third plane electrode in the specific direction;
the third plane electrode is a ground electrode;
the second plane electrode and the ground electrode define a capacitor; and
a total length of the first via conductor is shorter than a total length of the second via conductor.

2. An LC resonator comprising:
a first plane electrode;
a second plane electrode opposed to at least a portion of the first plane electrode in a specific direction;
a first line electrode;
a first via conductor and a second via conductor extending from the first line electrode in the specific direction to be connected to the first plane electrode and the second plane electrode, respectively;
a third plane electrode that is a ground electrode and is opposed to at least a portion of the second plane electrode in the specific direction;
a ground terminal opposed to at least a portion of the third plane electrode in the specific direction; and
at least one ground via connector which connects the ground terminal to the third plane electrode; wherein
the second plane electrode is between the first plane electrode and the third plane electrode in the specific direction; and
the second plane electrode and the ground electrode define a capacitor.

3. An LC resonator comprising:
a first plane electrode;
a second plane electrode opposed to at least a portion of the first plane electrode in a specific direction;
a first line electrode;
a first via conductor and a second via conductor extending from the first line electrode in the specific direction to be connected to the first plane electrode and the second plane electrode, respectively; and
a third plane electrode opposed to at least a portion of the second plane electrode in the specific direction; wherein
the second plane electrode is between the first plane electrode and the third plane electrode in the specific direction;
the third plane electrode is a ground electrode;
the second plane electrode and the ground electrode define a capacitor; and
the first plane electrode and the second plane electrode define another capacitor.

4. An LC filter comprising:
a first terminal and a second terminal; and
a first LC resonator and a second LC resonator; wherein
both of the first LC resonator and the second LC resonator have a same configuration as the LC resonator according to claim 3;
the first plane electrode of the first LC resonator is electrically connected to the first terminal; and
the first plane electrode of the second LC resonator is electrically connected to the second terminal.

5. The LC resonator according to claim 3, wherein only a portion of the second plane electrode overlaps the first plane electrode.

6. The LC resonator according to claim 3, wherein the first line electrode, the first via conductor, and the second via conductor together define an inductor.

7. The LC resonator according to claim 6, wherein
the first capacitor is connected in parallel with the inductor; and
the first capacitor and the inductor are both connected in series with the second capacitor.

8. The LC resonator according to claim 3, wherein a total length of the first via conductor is shorter than a total length of the second via conductor.

9. An LC filter comprising:
a first terminal and a second terminal; and
a first LC resonator and a second LC resonator; wherein
both of the first LC resonator and the second LC resonator have a same configuration as the LC resonator according to claim 3;
the third plane electrode of the first LC resonator is electrically connected to the first terminal; and
the third plane electrode of the second LC resonator is electrically connected to the second terminal.

10. The LC filter according to claim 9, further comprising:
an LC parallel resonator to receive a signal from one of the first LC resonator and the second LC resonator, and to transmit the signal to another one of the first LC resonator and the second LC resonator.

11. The LC filter according to claim 9, further comprising:
a ground inductor connected between ground and both the first LC resonator and the second LC resonator.

12. The LC filter according to claim 11, further comprising:
a capacitor provided in series with the first terminal and the second terminal.

13. The LC filter according to claim 9, wherein the first terminal and the second terminal are both land grid array terminals which are provided on a bottom surface of a multilayer body which includes the first LC resonator and the second LC resonator.

14. The LC filter according to claim 13, further comprising:
a ground terminal provided on the bottom surface of the multilayer body.

15. The LC filter according to claim 14, further comprising:
a ground inductor connected between ground and both the first LC resonator and the second LC resonator; wherein
the ground inductor is defined by via conductors connected to the ground terminal.

16. The LC filter according to claim 9, further comprising:
a third LC resonator and a fourth LC resonator; wherein
both of the third LC resonator and the fourth LC resonator has a same configuration as the LC resonator according to claim 3.

17. The LC filter according to claim 16, wherein
the third LC resonator and the fourth LC resonator are connected in parallel with one another; and
the first LC resonator and the second LC resonator are connected in series between the first terminal and the second terminal.

18. The LC filter according to claim 16, wherein all of the first LC resonator, the second LC resonator, the third LC resonator, and the fourth LC resonator are connected in parallel with one another.

19. The LC filter according to claim 18, further comprising:
a first coupling capacitance between the first LC resonator and the first terminal; and
a second coupling capacitance between the second LC resonator and the second terminal.

20. The LC filter according to claim 19, further comprising:
a third coupling capacitance between the first LC resonator and second LC resonator.

* * * * *